United States Patent
Hiew et al.

(10) Patent No.: US 7,687,921 B2
(45) Date of Patent: Mar. 30, 2010

(54) HIGH DENSITY MEMORY DEVICE MANUFACTURING USING ISOLATED STEP PADS

(75) Inventors: Siew S. Hiew, San Jose, CA (US); Nan Nan, San Jose, CA (US); Abraham C. Ma, Fremont, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 150 days.

(21) Appl. No.: 12/115,482

(22) Filed: May 5, 2008

(65) Prior Publication Data

US 2009/0273096 A1 Nov. 5, 2009

(51) Int. Cl.
*H01L 23/48* (2006.01)
*H01L 21/00* (2006.01)
(52) U.S. Cl. ............... 257/777; 257/784; 257/E23.024; 257/E21.506; 438/109
(58) Field of Classification Search ................. 257/777, 257/784, E23.024, E21.506; 438/109
See application file for complete search history.

(56) References Cited

U.S. PATENT DOCUMENTS

| | | | | |
|---|---|---|---|---|
| 5,373,189 A | * | 12/1994 | Massit et al. ................. | 257/686 |
| 6,972,487 B2 | * | 12/2005 | Kato et al. ................... | 257/723 |
| 6,979,905 B2 | * | 12/2005 | Nishida et al. .............. | 257/777 |
| 2002/0140107 A1 | * | 10/2002 | Kato et al. ................... | 257/777 |
| 2003/0137042 A1 | * | 7/2003 | Mess et al. ................... | 257/686 |
| 2004/0150084 A1 | * | 8/2004 | Nishida et al. .............. | 257/678 |
| 2007/0218588 A1 | | 9/2007 | Takiar et al. | |

\* cited by examiner

*Primary Examiner*—Lex Malsawma
(74) *Attorney, Agent, or Firm*—Bever, Hoffman & Harms, LLP; Patrick T. Bever

(57) ABSTRACT

An electronic device includes multiple IC dies stacked in an offset stacking arrangement on a substrate. Each IC die includes electrically isolated step pads that facilitates transmitting a dedicated signal between a (beginning) substrate bonding pad and a selected (terminal) contact pad of any die by way of short bonding wires that extend up the stack between the electrically isolated step pads. A memory devices includes stacked memory IC die, wherein "shared" signal transmission paths are formed by associated bonding wires that link corresponding contact pads of each memory die, and dedicated select/control signals are transmitted to each memory die by separate transmission paths formed in part by associated electrically isolated step pads. Substrate space overhung by the stack is used for passive components and IC dies. Memory controller die may be mounted on the stack and connected by dedicated transmission paths utilizing the electrically isolated step pads.

19 Claims, 16 Drawing Sheets

HIGH DENSITY MEMORY DEVICE MANUFACTURING USING ISOLATED STEP PADS

FIELD OF THE INVENTION

This invention relates to integrated circuit (IC) packages and, more particularly, to IC packages that include stacked integrated circuits.

BACKGROUND OF THE INVENTION

As the need increases for memory devices that are both smaller and have larger data capacities, advancements in stacked IC packaging techniques have been developed to facilitate this need. Stacked IC packaging generally involves stacking multiple integrated circuit dies onto a substrate within a single IC package.

One stacked IC packaging approach involves stacking the IC dies in a "pyramid" stacking arrangement in which a smaller die is stacked on a larger die, with both dies wire bonded to the substrate. The use of wire bonding necessarily requires that access to bonding pads of each of the dies be available; consequently, the upper die, when stacked on the lower die, must be small so as to not inhibit access to the bonding pads of the lower die. The "pyramid" stacking arrangement has, for example, been used with same function dies (e.g., two Flash memory dies) or different function dies (e.g., one Flash memory die and one SRAM die). Stacking of two or three dies has been done for stacked Chip Scale Packages (stacked CSP) and stacked Thin Small Outline Packages (TSOP). A disadvantage of the "pyramid" stacking arrangement is that the dies must be different sizes, which presents a problem in memory device applications where several like-sized memory dies are used.

Another conventional IC packaging approach that facilitates stacking like-sized dies involves placing a spacer (e.g., a relatively thick insulator) between the dies. Although the spacer provides sufficient space between the dies so that wire bonded to the lower die is made possible, the spacer disadvantageously either makes the IC package thicker, or limits the number of dies that can fit within the IC package of a predetermined thickness.

FIG. 19 is a simplified cross-sectional side view showing an electronic device 200 produced in accordance with a stacked IC packaging technique that is disclosed in Published U.S. Application No. 20070218588. Device 200 includes IC dies 212 to 218 disposed in a "staircase" stacking arrangement on a substrate 201, and are respectively connected to a finger pad 203 by way of wire bonds 222 to 228. Adhesive layers 232 to 238 are disposed under each IC die 212 to 218. A molded plastic housing 240 is formed over substrate 201, dies 212 to 218 and wire bonds 222 to 228.

The "staircase" stacking arrangement of device 200 avoids the problems of the spacer approach (discussed above) by exposing bond pads on each IC die without requiring a thick spacer between the dies. However, device 200 has several problems associated with the formation of wire bonds 222 to 228 between each IC die 212 to 218 and substrate 201. First, by forming wire bonds to each IC die, the number of IC die that can be stacked in the "staircase" stacking arrangement of device 200 is limited due to the increasing length of the wire bonds to the uppermost IC die (e.g., wire bonds 228). Further, because each IC die 212 to 218 is connected at its lower end to finger pad 203, the size of finger pad 203 must be made large to accommodate a potentially large number of wire bonds (thereby wasting substrate surface area in applications where a smaller number of die are used). Moreover, the longer wire bonds (e.g., wire bonds 226 and 228) are subject to greater parasitic inductances than shorter wire bonds, and the overlapping wire arrangement increases the risk that longer wire bonds may sag and short against the underlying shorter wire bonds. Additionally, as understood by those in the art, longer wire bonds are more prone to the wire sweep problem during molding process that can cause electrical open defects. Finally, the overlapping wire bond arrangement makes repair and reworking of a damaged or misplaced wire bond difficult without removing the wire bonds disposed over or adjacent to the damaged/misplaced wire bond.

FIG. 20 is a simplified cross-sectional side view showing an electronic device 300 produced in accordance with a "staggered" stacking arrangement, also disclosed in Published U.S. Application No. 20070218588, in which IC dies 312 to 318 disposed in an offset "staggered" arrangement on a substrate 301 such that every other die is connected to one of a first finger pad 303 or a second finger pad 305 by way of wire bonds 322 to 328. This approach reduces the length of the wire bonds extending to the uppermost IC die and may somewhat simplify repair/rework, but still has many of the problems discussed above with reference to the "staircase" stacking arrangement (e.g., the size of finger pads 303 and 205 must be made large, the wire bonds are subject to parasitic inductances, the overlapping wire arrangement increases the risk of sagging and shorting, and is subject to the wire sweep problem).

FIG. 21 is a simplified cross-sectional side view showing an electronic device 400 produced in accordance with another "staircase" stacking arrangement that is also disclosed in Published U.S. Application No. 20070218588. Similar to device 200 (discussed above), bonding wire 432 is connected between a finger pad 403 and a lowermost IC die 412. Device 400 differs from device 200 in that, instead of having each wire bond extend from the substrate to its associated IC die, subsequent bonding wires 424 to 428 of device 400 are connected between adjacent IC die (i.e., bonding wire 424 is connected between die 412 and die 414, bonding wire 426 is connected between die 414 and die 416, and bonding wire 428 is connected between die 416 and die 418). This wiring arrangement is utilized in, e.g., memory applications where "shared" (e.g., addressing and data) signals are transmitted to all of the memory dies. However, this arrangement has a problem in that it does not provide for dedicated (unshared) (e.g., Chip Select and Chip Enable) signals that are unique to each of the memory die. That is, the only way to send dedicated signals to each of IC die 412 to 418, based on the teachings of Published U.S. Application No. 20070218588, is to provide separate wire bonds extending from substrate 401 to each of IC dies 412 to 418 (i.e., similar to wire bonds 222 to 228, described above with reference to FIG. 2), which would be subject to the same problems as those described above with reference to FIG. 2.

FIG. 22 is a simplified cross-sectional side view showing an electronic device 500 produced in accordance with yet another stacking arrangement that is also disclosed in Published U.S. Application No. 20070218588. Similar to device 400 (discussed above), IC dies 512 to 518 are arranged in "staircase" stacking arrangement on substrate 501, and bonding wires 522 to 528 are connected between finger pad 503 and IC die 512, and between IC dies 514 to 518 in the manner that supports "shared" signals. In addition, another (e.g., a memory control) IC die 519 is mounted on IC die 518, and wire bonds 529 are connected between corresponding finger pad 505 and IC die 519 in order to support dedicated signals transmitted to and from IC die 519. This arrangement has problems similar to those discussed above with reference to FIG. 4, and in addition re-introduces the problems discussed above with reference to FIG. 2 regarding longer wire bonds.

What is needed is a method for producing electronic devices including stacked IC (e.g., memory or logic) dies that avoids the problems associated with the conventional stacking arrangements set forth above.

SUMMARY OF THE INVENTION

The present invention is directed to a packaged electronic device (e.g., a memory device) in which multiple IC dies are stacked in an offset (e.g., "staircase") stacking arrangement on a substrate, wherein a first IC die includes an electrically isolated step pad that facilitates transmitting a dedicated (unshared) signal between a bonding pad of the substrate and a selected contact pad of a second IC die that is mounted on the first IC die. That is, by utilizing electrically isolated step pads to transmit dedicated signals between the substrate the stacked IC dies mounted thereon, the present invention facilitates forming dedicated transmission paths between a substrate and any number of stacked IC dies that include only relatively short bonding wires (e.g., die-to-die wires that extend between the contact pads of adjacent IC dies in the stack, and optional intra-die bonding wires that extend between contact pads of the same IC die). By facilitating the production of electronic devices with stacked IC die using only relatively short bonding wires, the present invention avoids the problems associated with conventional production methods described above (e.g., the shorter bonding wires are easier to rework, avoid unwanted parasitic inductance, reduce the chance of breakage and the wire sweep problem during subsequent molding, and facilitate variable numbers of stacked IC dies without requiring enlarged bonding/contact pads). Further, the use of step pads facilitates electronic devices having multiple "nested" stacks of IC dies (i.e., where an IC stack is at least partially disposed in the overhang spaced defined by an adjacent IC stack).

According to an embodiment of the present invention, each IC die is produced or modified to include both contact pads and step pads disposed along one or more side edges to facilitate the stacked arrangement. In one embodiment a conventional IC die having contact pins disposed on opposing sides of the IC die is modified to include an insulation layer, elongated conductors formed on the insulation layer that facilitate forming functional contact pads along one of the side edges, and electrically isolated step pads that are formed on the insulation layer adjacent to the functional contact pads. Providing both functional contact pads and electrically isolated step pads along one of the side edges of each IC facilitates the formation of both dedicated and "shared" transmission paths that can be utilized in the production of large capacity memory devices. In an alternative embodiment, the functional contact pads and electrically isolated step pads are formed along two orthogonal edges of each IC die, facilitating a two-way offset stacked arrangement.

According to another embodiment of the present invention, a method for manufacturing electronic devices includes mounting a first IC die onto a substrate, forming a first set of bonding wires between said substrate and the first IC die, mounting a second IC die on the first IC die in an offset stacked arrangement, and forming a second set of bonding wires including die-to-die wires extending between the first and second IC dies, and optional intra-die wires that extend between selected step pads formed on the second IC die, or extend between a step pad and a contact pad of the second IC die. Subsequent IC die are then stacked and wire bonded in the manner of the second IC die. Using this approach, all bonding wires remain short and overlap is minimized, making re-work relatively easy. Further, this approach facilitates the production of many types of electronic devices using several stacked IC die arrangements. An optional plastic housing is molded over the stacked arrangement after the final wire bonding process is completed.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in methods for producing high density memory modules and other packaged electronic devices that include stacked integrated circuits. The following description is presented to enable one of ordinary skill in the art to make and use the invention as provided in the context of a particular application and its requirements. As used herein, directional terms such as "upper", "upwards", "lower", "downward", "front", "rear", are intended to provide relative positions for purposes of description, and are not intended to designate an absolute frame of reference. In addition, the phrases "integrally connected" and "integrally molded" is used herein to describe the connective relationship between two portions of a single molded or machined structure, and are distinguished from the terms "connected" or "coupled" (without the modifier "integrally"), which indicates two separate structures that are joined by way of, for example, adhesive, fastener, clip, or movable joint. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
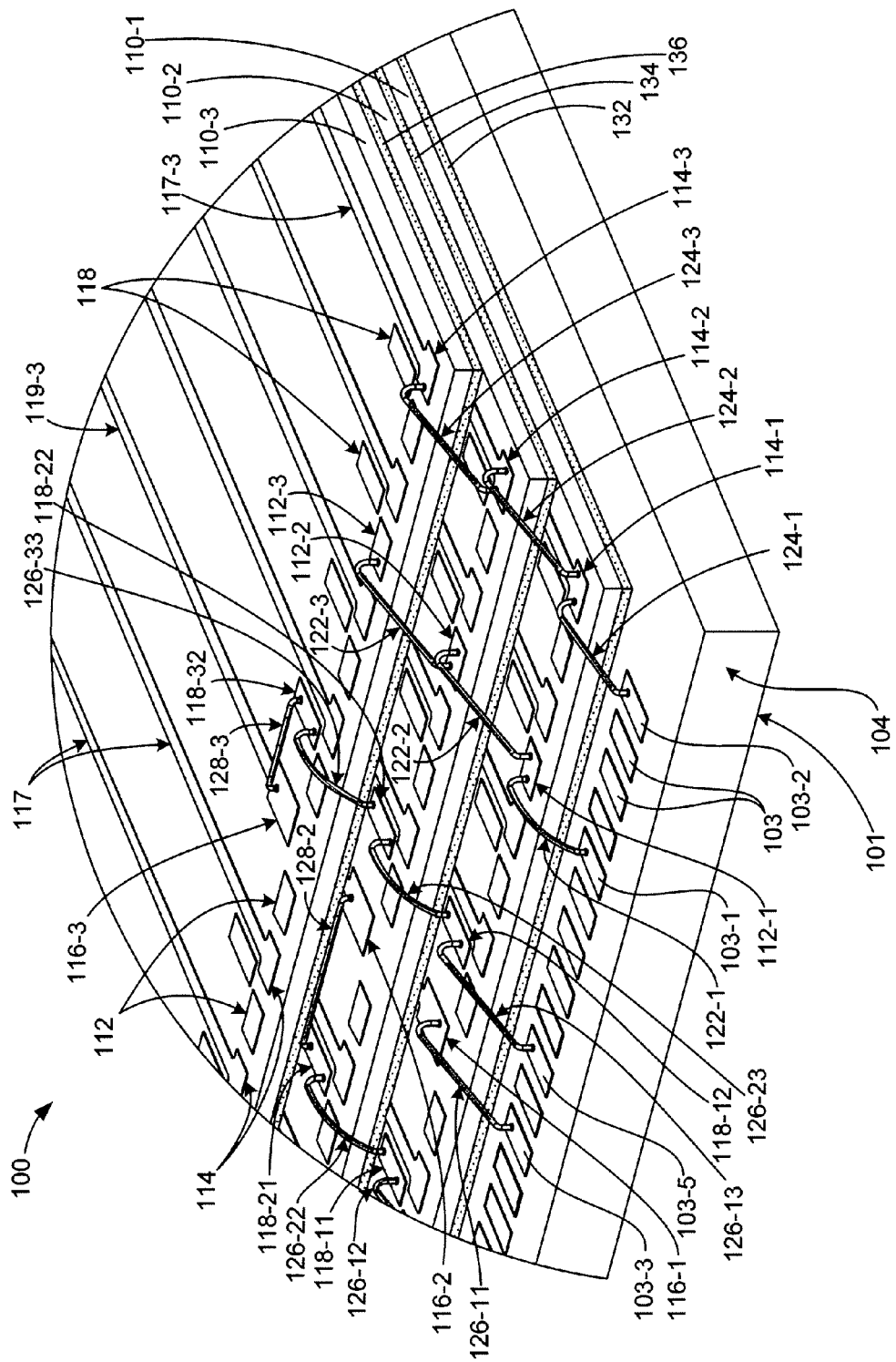
FIG. 1 is a partial top side perspective view showing a memory device with stacked IC dies according to an embodiment of the present invention.

FIG. 1 is a partial perspective view showing an electronic device 100 according to an embodiment of the present invention. Device 100 generally includes a substrate 101, a first integrated circuit (IC) die 110-1, a second IC die 110-2, and a third IC die 110-3.

Substrate 101 is constructed using known techniques, and is characterized by having a row of bonding pads 103 mounted along a side edge 104 thereof. Each bonding pad 103 is connected to a corresponding conductor (not shown) in accordance with known printed circuit board techniques.

As explained in additional detail below, each IC die 110-1 to 110-3 includes an internally disposed electronic circuit (not shown), and also includes several contact pads that are disposed on an upper surface thereof. The contact pads disposed on the upper surface of each IC die include (e.g., IC die 110-3) include both functional contact pads (e.g., pads 112, 114 and 116 of IC die 110-3), and electrically isolated step pads (e.g., step pads 118 of IC die 110-3). As described in additional detail below, the phrase "functional contact pad" is utilized to indicate that a metal pad (e.g., pads 112, 114 and 116 of IC die 110-3) disposed on the upper surface of each IC die is connected by internal metal conductor to the electronic circuit of that IC die. Further, the functional contact pads of each IC die include both "shared" contact pads and "dedicated" contact pads. In one embodiment, IC dies 110-1, 110-2 and 110-3 include identical memory circuits that, as understood by those in the art, may be connected to receive "shared" control/data signals on predetermined contact pads thereof (e.g., contact pads 112 and 114 of IC die 110-3), but require that dedicated (unshared) control signals be transmitted to one or more dedicated contact pads thereof (e.g., contact pad 116-3 of IC die 110-3). In contrast to functional contact pads, the phrase "electrically isolated step pads" is utilized to indicate that a metal pad (e.g., pads 118 of IC die 110-3) disposed on the upper surface of each IC die is electrically isolated from the electronic circuit of that IC die (i.e., unless connected by wire bond to a functional contact pad, as described below). Note that, for purposes of clarity, the terms "contact pads", "step pads" and "bonding pads" are used herein to distinguish between functional/isolated metal pads formed on IC dies (which are referred to as "contact pads" and "step pads, respectively) and the metal pads formed on substrate 101 (which are referred to as "bonding pads"), but are not intended to infer differences other than those described herein.

Referring to FIG. 1, IC dies 110-1, 110-2 and 110-3 are mounted on substrate 101 in a "staircase" stacked arrangement, wherein first IC die 110-1 is secured to an upper surface of substrate 101 by way of a first adhesive layer 132, second IC die 110-2 is secured to an upper surface of first IC die 110-1 by way of a second adhesive layer 134, and third IC die 110-3 is secured to an upper surface of second IC die 110-2 by way of a third adhesive layer 136. Each successive IC die is offset to expose the bonding/contact pads of the previous layer. For example, first IC die 110-1 is positioned next to but not over bonding pads 103, and second IC die is positioned on first IC die 110-1 such that the contact pads of IC die 110-1 are exposed. This arrangement facilitates the wire bonding process described below.

In accordance with the present invention, device 100 only includes relatively short bonding wires, which are formed in accordance with known wire bonding techniques, and include both "die-to-die" wires that extend either from substrate 101 to first IC die 110-1 or between adjacent IC die in the stack, and "intra-die" wires that extend between step/contact pads on the same IC die (i.e., no bonding wires extend from substrate 101 to either of IC die 110-2 or IC die 110-3). For example, a first set of bonding wires extending between substrate 101 and first IC die 110-1 include a bonding wire 122-1 extending between bonding pad 103-1 and contact pad 112-1, a bonding wire 124-1 extending between bonding pad 103-2 and contact pad 114-1, a bonding wire 126-11 extending between a bonding pad 103-3 and contact pad 116-1, a bonding wire 126-12 extending between a bonding pad (not shown) and step pad 118-11, and a bonding wire 126-13 extending between a bonding pad 103-5 and step pad 118-12. Other bonding wires connected between substrate 101 and first IC die 110-1 are omitted for clarity, but are described in further detail below. A second set of bonding wires include die-to-die wires extending between first IC die 110-1 and second IC die 110-2, which include a bonding wire 122-2 extending between contact pad 112-1 and a contact pad 112-2, a bonding wire 124-2 extending between contact pad 114-1 and a contact pad 114-2, a bonding wire 126-22 extending between step pad 118-11 and a step pad 118-21, and a bonding wire 126-23 extending between step pad 118-12 and a step pad 118-22. In addition, the second set of bonding wires includes one intra-die wire 128-2 extending between step pad 118-21 and contact pad 116-2. A third set of bonding wires include die-to-die wires extending between second IC die 110-2 and third IC die 110-3, which include a bonding wire 122-3 extending between contact pad 112-2 and a contact pad 112-3, a bonding wire 124-3 extending between contact pad 114-2 and a contact pad 114-3, and a bonding wire 126-33 extending between step pad 118-22 and a step pad 118-32. In addition, the third set of bonding wires includes one intra-die wire 128-3 extending between step pad 118-32 and contact pad 116-3.

In accordance with the bonding wire arrangement depicted, for example, in FIG. 1, the present invention facilitates both shared transmission paths and dedicated transmission paths to any number of IC die in a stacked arrangement without requiring any wire bonds that extend from substrate 101 to any IC die mounted on lowermost IC die 110-1. The combined shared/dedicated transmission path arrangement described herein is particularly relevant to memory devices, but may be utilized in other electronic devices as well.

Shared signal paths are provided between selected bonding pads and associated "shared signal" (also referred to herein as "shared function") contact pads by way of intervening bonding wires that are connected between each adjacent pair of associated contact pads. For example, a first shared transmission path is formed between bonding pad 103-1 and contact pads 112-1, 112-2 and 112-3 by way of bonding wires 122-1, 122-2 and 122-3. Similarly, a second shared transmission path is formed between bonding pad 103-2 and contact pads 114-1, 114-2 and 114-3 by way of bonding wires 124-1, 124-2 and 124-3. These shared transmission paths facilitate the simultaneous transmission of a single signal (e.g., a memory address) to all of IC die 110-1, 110-2 and 110-3 by way of the respective shared signal contact pads.

Similarly, dedicated transmission paths are provided between selected bonding pads and a selected functional contact pad by way of one or more electrically isolated step pads. For example, a dedicated transmission path is provided between a selected bonding pad (not shown in FIG. 1) and contact pad 116-2 by way of step pad 118-11 (i.e., the signal transmitted from the selected bonding pad is transmitted from bonding wire 126-12 to bonding wire 126-22 through step pad 118-11, and from bonding wire 126-21 to contact pad 116-2 by way of step pad 118-21 and intra-die wire 128-2). Similarly, a dedicated transmission path is provided between bonding pad 103-5 and contact pad 116-3 by way of step pads 118-12, 118-22 and 118-32 (i.e., in conjunction with die-to-die bonding wires 126-13, 126-23, and 126-33, and intra-die wire 128-3). In a similar fashion described in additional detail below, dedicated transmission paths are provided for any number of IC die disposed in a stacked arrangement. These dedicated signal paths facilitate the transmission of unique signals (e.g., Chip Select and Chip Enable) to each of IC die 110-1, 110-2 and 110-3 by way of dedicated contact pads 116-1, 116-2 and 116-3.

It is noted that the particular dedicated signal paths shown in FIG. 1 are intended to be exemplary and not limiting. For example, as described with reference to FIG. 11(C) below, it is possible to provide dedicated transmission paths without the use of intra-die wires (e.g., wires 128-2 and 128-3, both shown in FIG. 1 and mentioned above). However, the inventors also note that the use of intra-die wires provides the advantages of minimizing wire length and simplifying the bonding wire arrangement in a way that may make rework easier in some applications.

Figure 2:
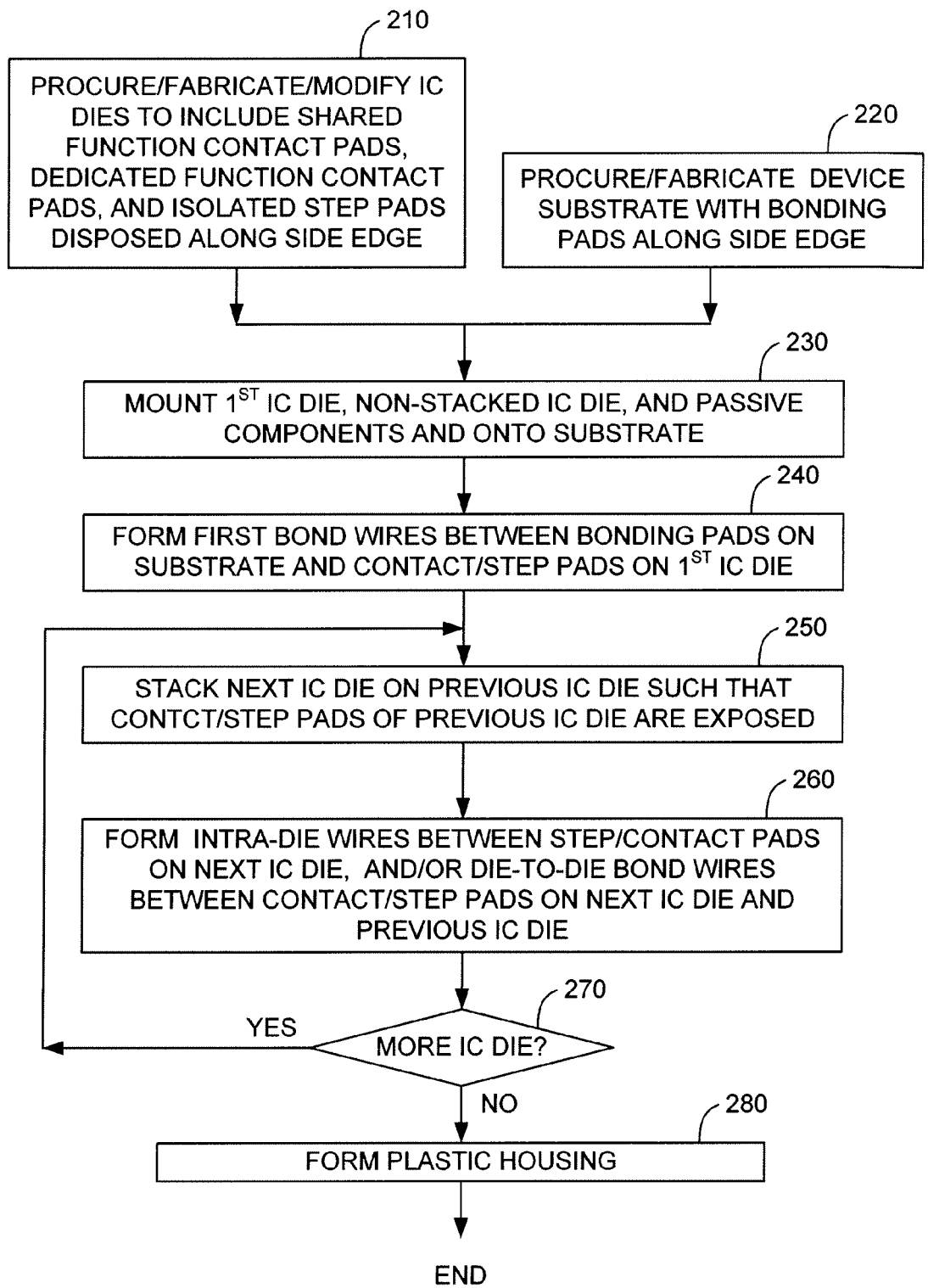
FIG. 2 is a flow diagram showing a generalized method for producing the memory device of FIG. 1 according to another embodiment of the present invention.

FIG. 2 is a flow diagram showing a generalized method for producing electronic circuits (e.g., memory device 100, described above with reference to FIG. 1) according to another embodiment of the present invention. The method begins by procuring, fabricating, or modifying previously fabricated IC dies in the manner described below such that the shared function contact pads, dedicated function contact pads, and electrically isolated step pads of each IC die (e.g., IC dies 110-1, 110-2 and 110-3, described above with reference to FIG. 1) are disposed along a side edge of each IC die (block 210), and procuring or otherwise fabricating substrates (e.g., substrate 101, described above with reference to FIG. 1) having bonding pads disposed along a side edge thereof (block 220). Next, a first IC die (e.g., die 110-1, described above with reference to FIG. 1), any "non-stacked" IC die, and any passive components of the electronic device are mounted onto the substrate (block 230), and a first wire bonding process is performed to provide bonding wires to the first IC die and any non-stacked IC die (block 240). A second ("next") IC die (e.g., IC die 110-2, described above with reference to FIG. 1) is mounted on the first ("previous") IC die in the stacked arrangement described above (block 250), and then a second wire bonding process is performed to provide intra-die wires (if any) between step/contact pads of the second IC die, and die-to-die bonding wires between the contact/step pads of the first IC die and the second IC die (block 260). The process of blocks 250 and 260 is then repeated for each IC die in the stack ("YES" branch from block 270) until all IC die are stacked and wire bonded ("NO" branch from block 270). Finally, a plastic housing is formed over the stack using known molding techniques (block 280) to complete the production process. Each of the processes set forth in the blocks of FIG. 2 are described below in additional detail according to various exemplary embodiments.

Figure 3A:
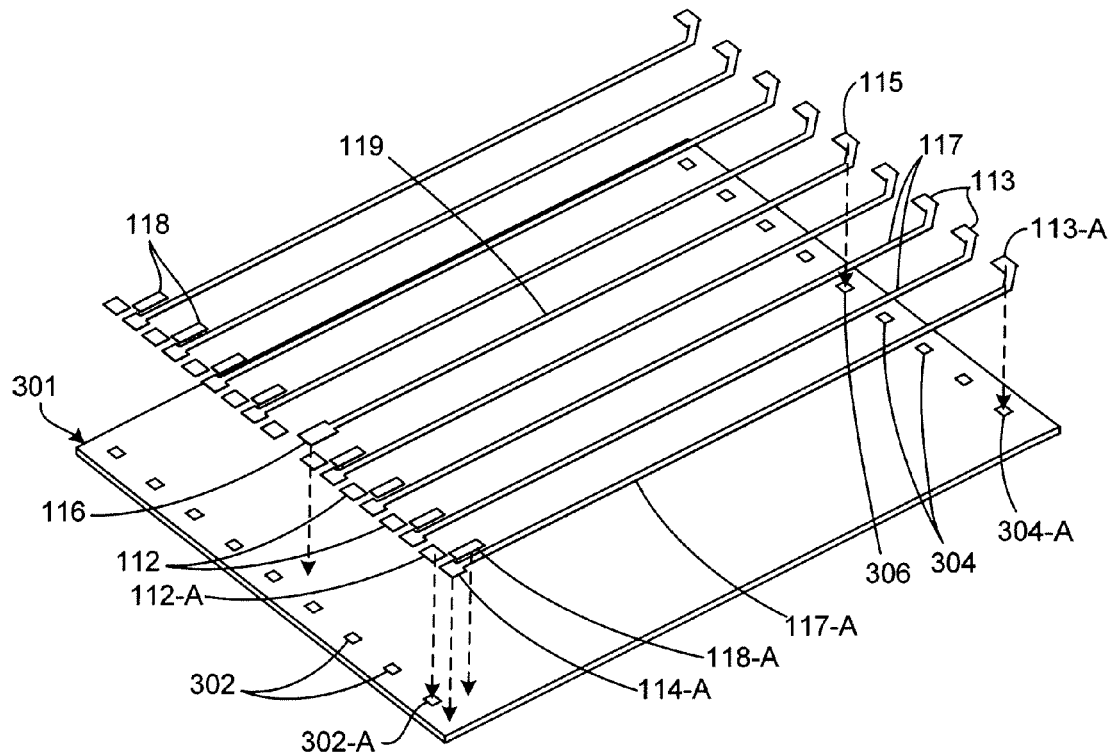
FIGS. 3(A) and 3(B) are exploded perspective and assembled perspective views depicting an IC die utilized in the production of the memory device of FIG. 1.
Figure 3B:
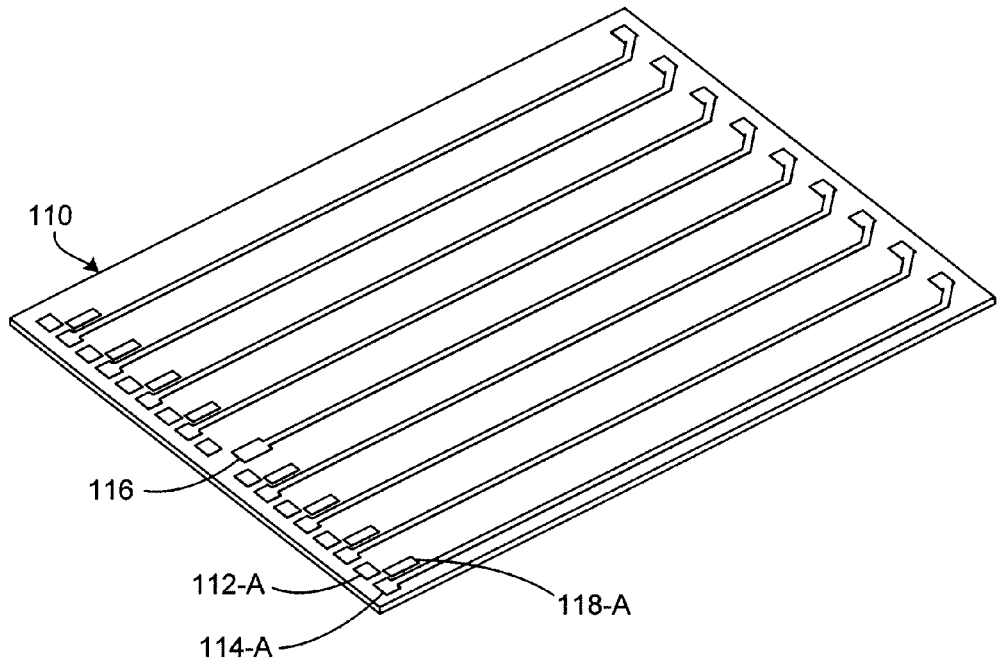

FIGS. 3(A) and 3(B) are exploded perspective and assembled perspective views depicting the modification of a conventional IC die 301 to produce an IC die 110 utilized in accordance with an embodiment of the present invention. As indicated in FIG. 3(A), conventional IC die 301 includes relatively small contact pins 302 and 304/306 that are disposed on opposing side edges thereof. The modification process includes forming a first group of contact pads 112 that are electrically connected to contact pins 302. Note that each contact pads 112 is sized to facilitate the connection of two bonding wires. In addition, a second group of contact pads (e.g., 114 and 116) is formed adjacent to contact pads 112, where each contact pad of the second group is electrically connected to corresponding contact pin by way of an associated elongated conductor that extends across IC die 301. For example, each shared function contact pad 114 (e.g., contact pad 114-A) is electrically connected to corresponding contact pin 304 (e.g., pin 304-A) by way of an associated remote contact 113 (e.g., contact 113-A) and an associated elongated conductor 117 (e.g., conductor 117-A). Similarly, each dedicated function contact pad (e.g., contact pad 116) is electrically connected to corresponding contact pin (e.g., pin 306) by way of an associated remote contact (e.g., contact 115) and an associated elongated conductor (e.g., conductor 119). Finally, a predetermined number of electrically isolated step pads 118 (e.g., step pad 118-A) are disposed adjacent to but spaced from the first and second groups of functional contact pads. The modified IC die 110 is indicated in FIG. 3(B).

Figure 4:
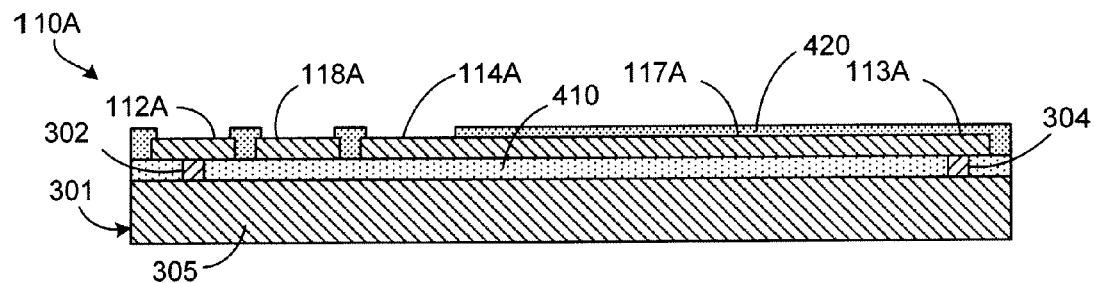
FIG. 4 is a simplified cross-sectional side view depicting bonding pads of the IC die of FIG. 3.

FIG. 4 is a simplified cross-sectional side view depicting IC die 110 in additional detail. Conventional IC die 301 includes an electronic circuit 305 (shown in simplified form) that is accessible by way of (i.e., electrically connected to) contact pins 302 and 304. An insulation layer (e.g., oxide) 410 is disposed on an upper surface of conventional die 301 according to known techniques, and is patterned using known techniques to expose contact pins 302, 304 and 306. A metallization layer is then deposited and patterned using known techniques to form the contact structure shown in FIG. 3(A), whereby contact pads 112, 114, 118 and 118 are formed on insulation layer 410. Specifically, contact pads 112 are formed on insulation layer 410 along the left side edge of die 301 such that each contact pad 112 (e.g., contact pad 112-A) is electrically connected to a corresponding contact pin 302, thereby facilitating the transmission of signals between electronic circuit 305 and contact pads 112. Contact pads 114 (i.e., including corresponding remote contacts 113 and elongated structures 117) are formed on insulation layer 410 such that each contact pad 114 (e.g., contact pad 114-A) is disposed adjacent to the left side edge of die 301, its associated remote contact 113 (e.g., contact 113-A) is disposed over and electrically connected to a corresponding contact pin 304 (e.g., pin 304-A), and its associated elongated conductor 117 (e.g., conductor 117-A) extends across die 301 on insulation layer 410, thereby facilitating the transmission of signals between electronic circuit 305 and contact pads 114. Similarly, dedicated contact pad 116 (shown in FIG. 3(A) and 3(B)) is formed on insulation layer 410 adjacent to the left side edge of die 301, its associated remote contact 115 is disposed over and electrically connected to contact pin 306, and its associated elongated conductor 119 extends across die 301. Finally, according to the present invention, step pads 118 (e.g., pad 118-A) are formed on insulation layer 410 adjacent to but spaced from contact pads 112, 116, and 118 such that each step pad is electrically isolated from electronic circuit 305 (i.e., step pads 118 are not in contact with any pins 302, 304 or 306). A passivation layer 420 is then deposited over die 310 and patterned to expose only a top surface of each contact pad 112, 114, 116 and 118 such that the peripheral edges of each contact pad 112, 114, 116 and 118 is surrounded by portions of passivation layer 420, and such that remote contacts 113 and 115 and elongated conductors 117 and 119 are prevented from shorting to die stacked thereon. Providing both functional contact pads 112A and 114A and electrically isolated step pad 118A along one of the side edges of each IC facilitates the formation of both dedicated and "shared" transmission paths that can be utilized in the production of large capacity memory devices.

Figure 5A:
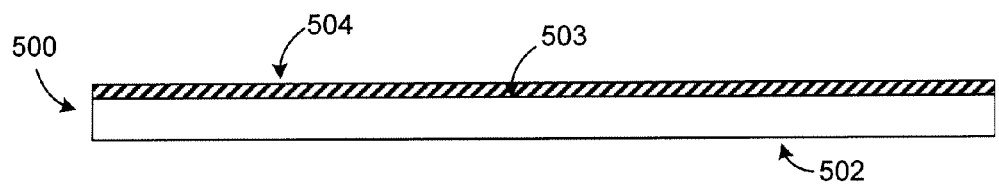
FIGS. 5(A), 5(B) and 5(C) are simplified cross-sectional side views showing wafer processing steps utilized to produce the IC die of FIG. 3.
Figure 5B:
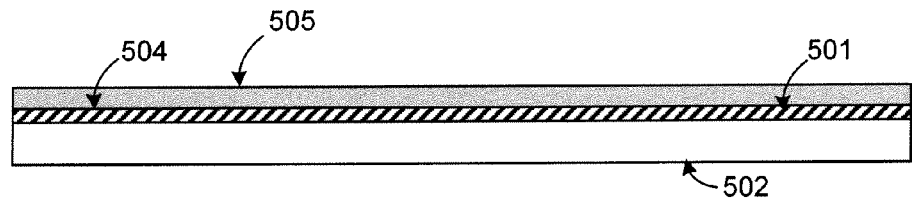
Figure 5C:
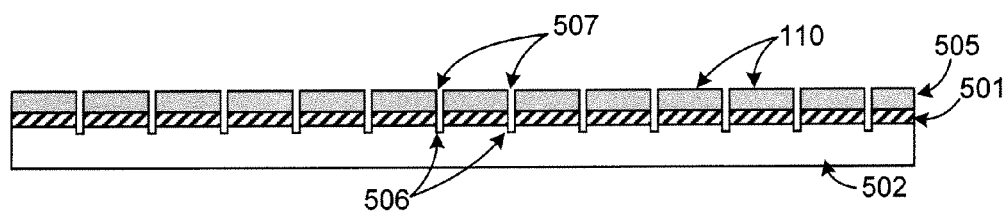

FIGS. 5(A), 5(B) and 5(C) are simplified cross-sectional side views showing wafer processing steps utilized to produce IC die 110 according to another embodiment of the present invention. After processing a wafer to form multiple IC circuits having the contact pad arrangement described above with reference to FIG. 4(A), an adhesive tape (e.g., blue or UV type) is applied using a ring frame onto active surface to hold the wafer portions in place as well as to protect active surface. The taped wafer is then mounted onto a grind machine's chuck with plastic surface facing the chuck surface. A wafer grinding process is then performed according to known techniques on non-active surface in order to minimize the thickness of wafer. UV type tape is preferred when grinding is performed as the grinded wafer is paper thin, and tape removal using blue tape sometime causes wafer crack, whereas UV tape's adhesiveness can be reduced by exposing UV tape to the UV light. After completion of grinding process, the ring frame tape is removed, and the backside grinded surface wafer is then attached to a film tape 500, which is shown in FIG. 5(A). Film tape 500 includes a very thin layer of double sided adhesive tape 501 which sticks on the wax like surface 503 of a plastic sheet 502. The wafer backside (non-active surface) of wafer 505 is then taped onto top surface 504 of double sided adhesive tape 501, as shown in FIG. 5(B). Wafer 505 is the diced into individual die 110 as shown in FIG. 5(C). Note that the disc saw follows each scribe lane 507 as it cuts through wafer 505. The disc saw also cuts through double sided adhesive tape 501, and over cuts into plastic sheet layer 502 by about 5% of its' total thickness. The overcut regions 506 are shown in FIG. 5(C).

Figure 6A:
FIGS. 6(A) and 6(B) are simplified side and top plan views, respectively, showing a substrate of the electronic device of FIG. 1.
Figure 6B:
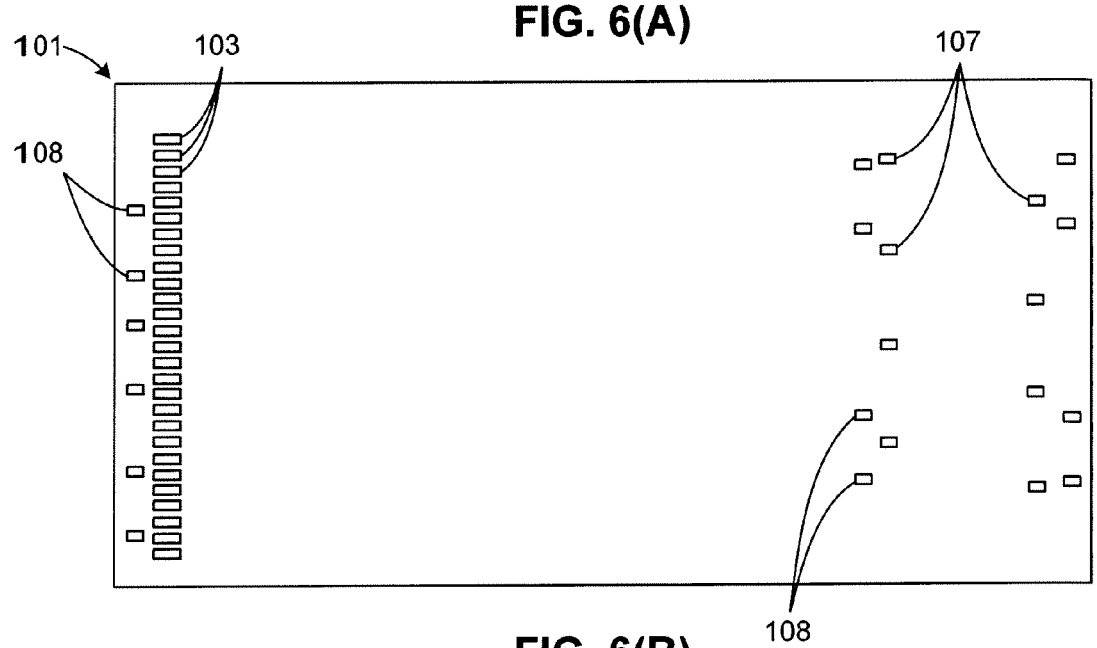

FIGS. 6(A) and 6(B) are simplified side and top plan views, respectively, showing substrate 101 as provided in block 220 of FIG. 2. Substrate 101 is produced using any known suitable material (e.g., FR4, BT or ceramic) with predetermined circuit connections provided in accordance with known techniques that are connected to bonding pads 103 as well as to optional additional bonding pads 107 provided for other "non-stacked" IC die, and also surface mount pads 108 for mounting discrete or passive components and any other surface mount components required to produce the desired electronic device.

Figure 7A:
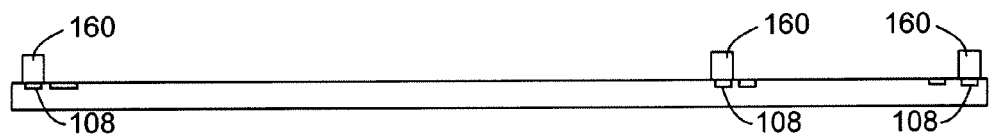
FIGS. 7(A) and 7(B) are simplified side and top plan views, respectively, showing the substrate of FIG. 6(A) with passive devices mounted thereon.
Figure 7B:
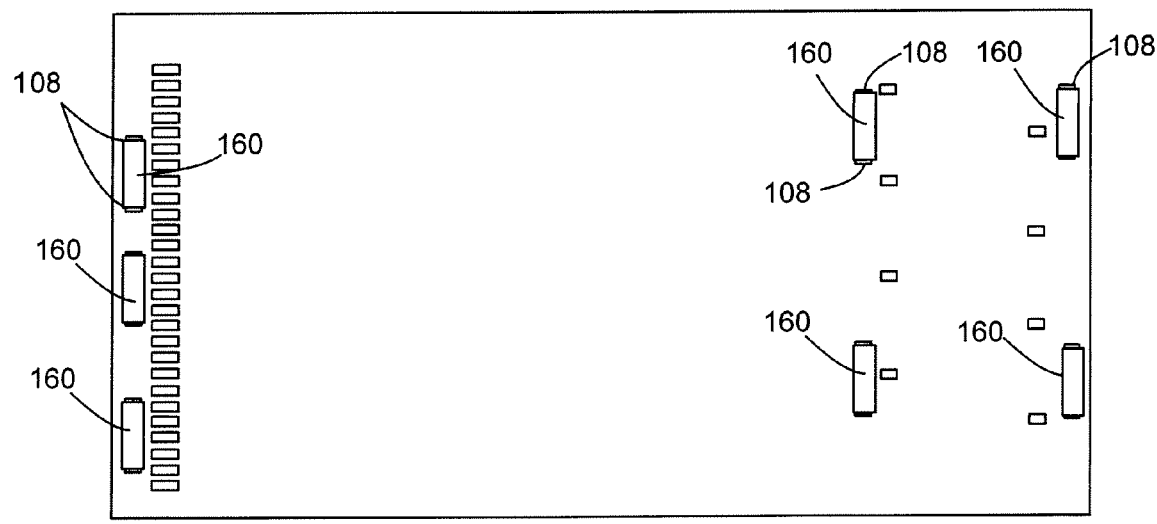
Figure 8A:
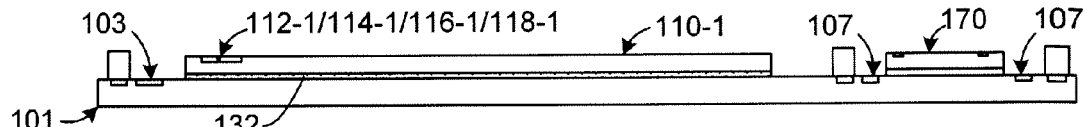
FIGS. 8(A) and 8(B) are simplified side and top plan views, respectively, showing the substrate of FIG. 7(A) with a first IC die mounted thereon.
Figure 8B:
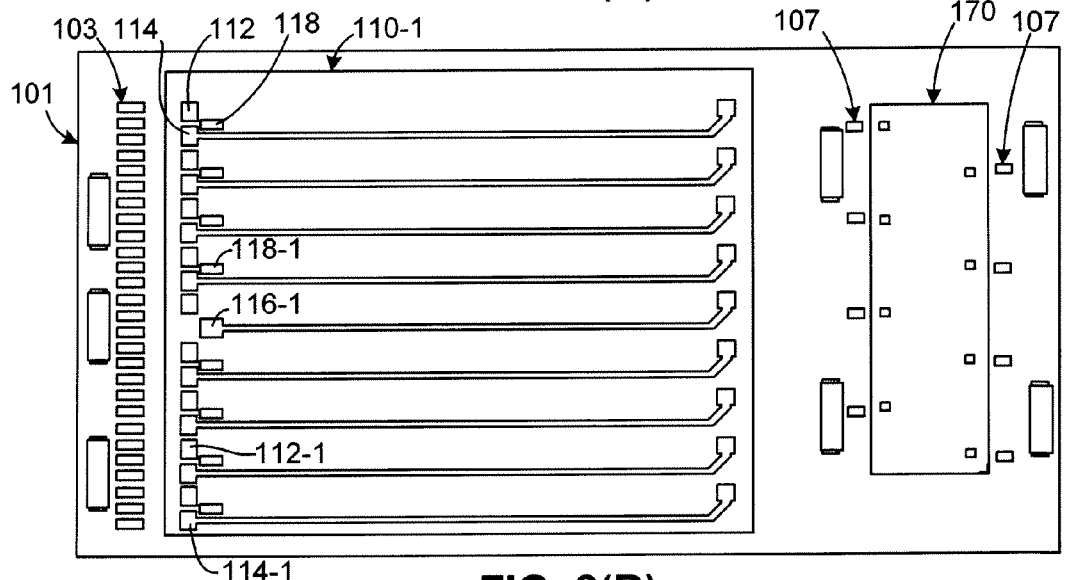

FIGS. 7(A) and 7(B) are simplified side and top plan views, respectively, showing substrate 101 with discrete or passive components 160 mounted onto surface mount pads 108 using known surface mount technology, and FIGS. 8(A) and 8(B) are simplified side and top plan views, respectively, showing substrate 101 with IC die 110-1 and a "non-stacked" IC die 170 mounted thereon, thereby completing the process of block 230 (FIG. 2). Note that IC die 110-1 is mounted on substrate 101 by way of adhesive layer 132 such that its contact pads (e.g., functional contact pads 112-1, 114-1, and 116-1, and step pads 118-1) are disposed adjacent to bonding pads 103. Similarly, "non-stacked" IC die 170 is mounted using an adhesive between contact pads 107 to facilitate wire bonding thereto.

Figure 9A:
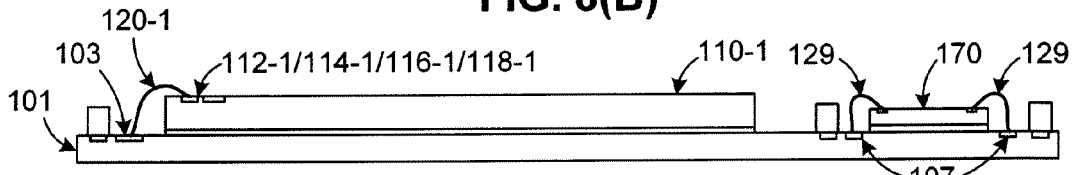
FIGS. 9(A) and 9(B) are simplified side and top plan views, respectively, showing the assembly of FIG. 8(A) after the first IC die is wire bonded to the substrate.
Figure 9B:
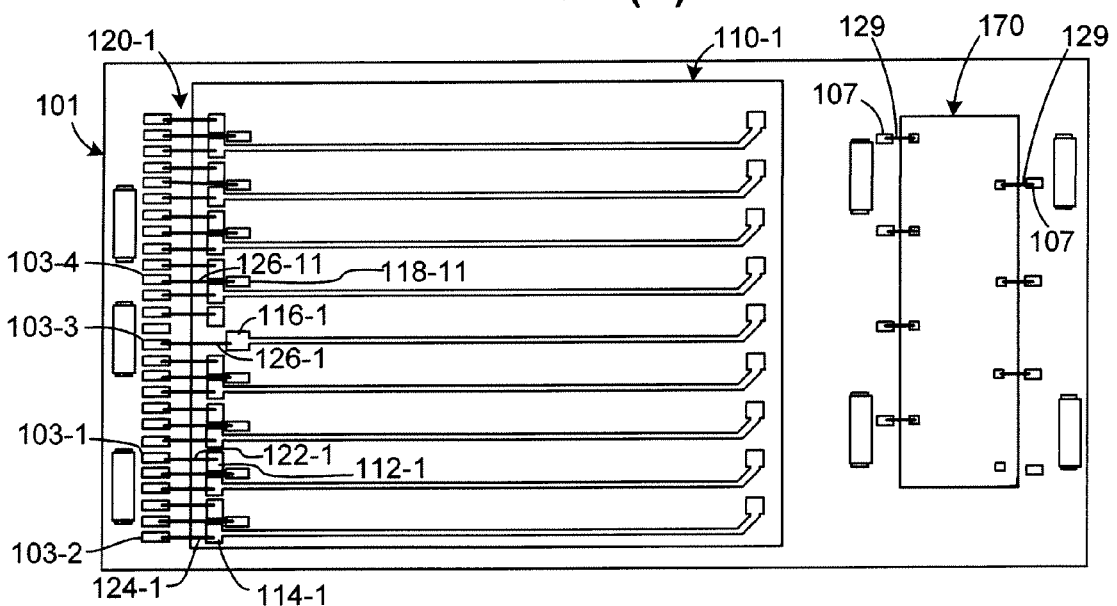

FIGS. 9(A) and 9(B) are simplified side and top plan views, respectively, depicting the formation of first wire bonds 120-1 between bonding pads 103 of substrate 101 and contact pads 112-1, 114-1, 116-1 and 118-1 of IC die 110-1, and the formation of wire bonds 129 between bonding pads 107 and non-stacked IC die 170 according to block 240 of FIG. 2. As indicated in FIG. 9(B), the first bonding process specifically includes forming bonding wire 122-1 between bonding pad 103-1 and shared function contact pad 112-1, forming bonding wire 124-1 between bonding pad 103-2 and shared function contact pad 114-1, forming bonding wire 126-1 between bonding pad 103-3 and dedicated function contact pad 116-1, and forming bonding wire 126-11 between bonding pad 103-4 and step pad 118-11. Other bonding wires associated with first bonding wires 120-1 are depicted between associated bonding pads and associated contact pads by straight lines in FIG. 9(B).

Figure 10A:
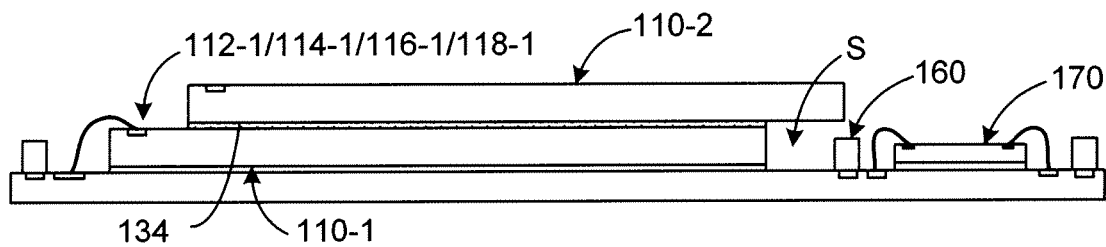
FIGS. 10(A) and 10(B) are simplified side and top plan views, respectively, showing the assembly of FIG. 9(A) after a second IC die is mounted onto the first IC die.
Figure 10B:
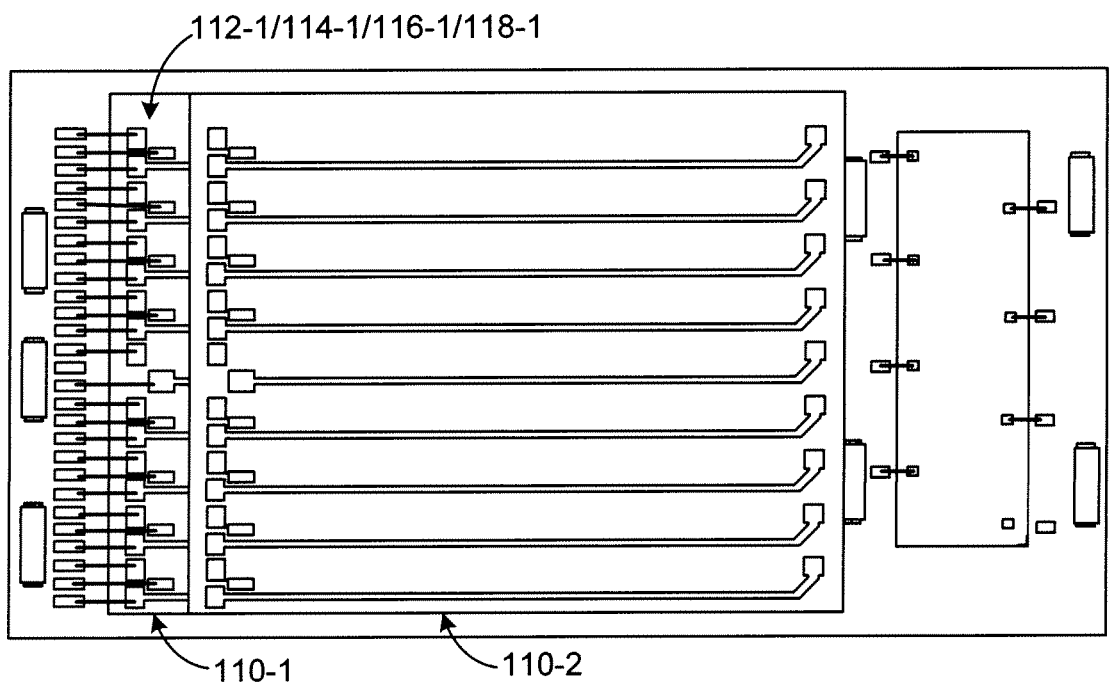

FIGS. 10(A) and 10(B) are simplified side and top plan views, respectively, depicting the mounting of second IC die 110-2 onto first IC die 110-1 according to block 250 of FIG. 2 (first pass). As mentioned above, IC die 110-2 is mounted by way of adhesive layer 134, and is positioned such that contact pads 112-1, 114-1, 116-1 and 118-1 of IC die 110-1 remain exposed. Note also that passive component 160 is disposed in overhang space S device defined by the right end of IC die 110-2.

Figure 11A:
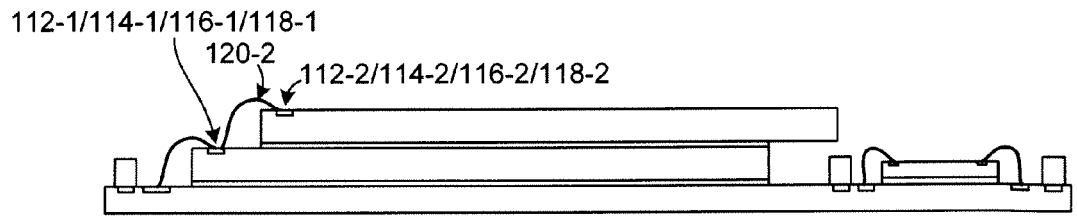
FIGS. 11(A), 11(B) and 11(C) are a simplified side view, a first top plan view, and a second top plan view, respectively, showing the assembly of FIG. 10(A) after the second IC die is wire bonded to the first IC die according to alternative embodiments.
Figure 11B:
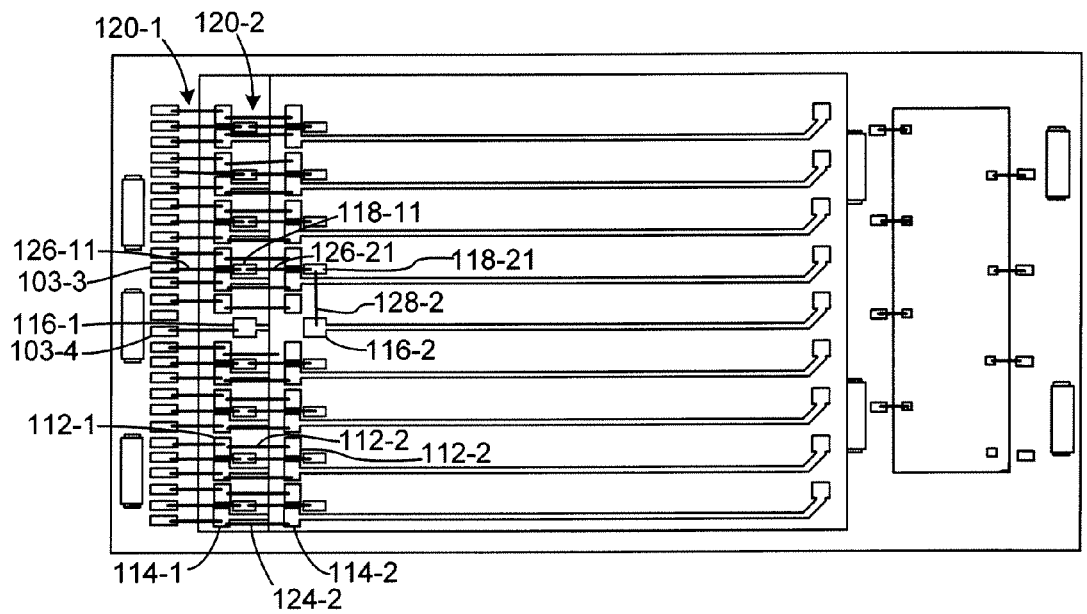
Figure 11C:
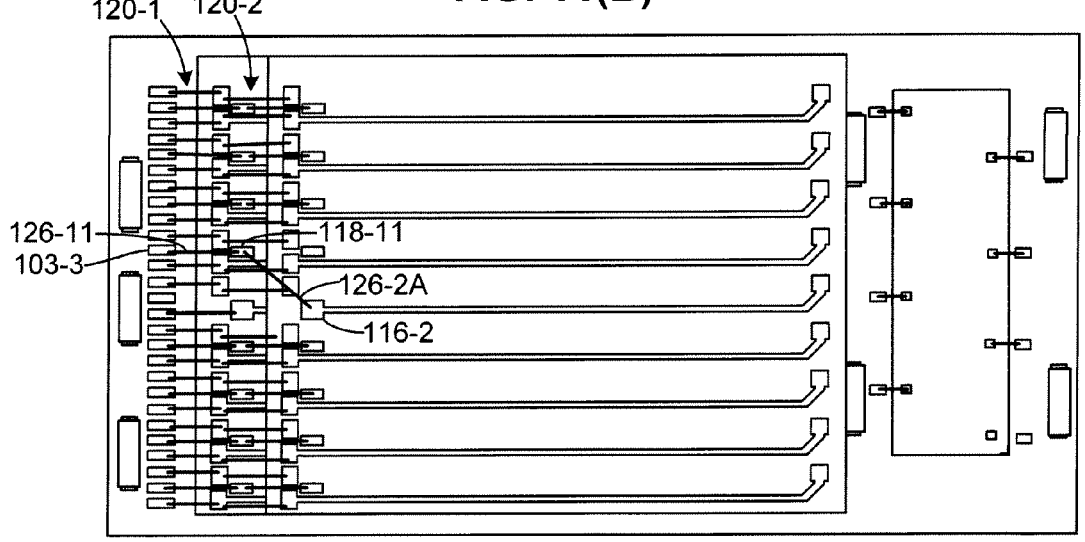

FIG. 11(A) is a top plan view simplified side view depicting the formation of second bonding wires 120-2 between first IC die 110-1 and second IC die 110-2 according to block 260 of FIG. 2 (first pass). FIGS. 11(B) and 11(C) are top plan views depicting alternative arrangements of second bonding wires 120-2.

Referring to FIGS. 11(A) and 11(B), according to the embodiments described above, the second bonding process specifically includes forming bonding wire 122-2 between shared function contact pad 112-1 and shared function contact pad 112-2, forming bonding wire 124-2 between shared function contact pad 114-1 and shared function contact pad 114-2, and forming bonding wire 126-21 between step pad 118-11 and step pad 118-21. In addition, second bonding wires 120-2 include intra-die wire 128-2 that is connected between step pad 118-21 and dedicated function contact pad 116-2. As such, the second wire bonding process produces a dedicated transmission path between bonding pad 103-3 and dedicated function contact pad 116-2 by way of bonding wire 126-11, step pad 118-11, bonding wire 126-21, step pad 118-21, and intra-die bonding wire 128-2. Other bonding wires associated with first bonding wires 120-1 are depicted between associated bonding pads and associated contact pads by straight lines in FIG. 9(B).

FIG. 11(C) is a top plan view depicting an alternative embodiment of the second wire bonding process in which a dedicated transmission path between bonding pad 103-3 and dedicated function contact pad 116-2 is generated by way of bonding wire 126-11, step pad 118-11, and diagonal bonding wire 126-2A. This alternative embodiment illustrates that it is possible to provide dedicated transmission paths without the use of intra-die wires. As such, the appended claims should not be limited to embodiments including intra-die wires unless such limitations are specifically recited therein.

Figure 12:
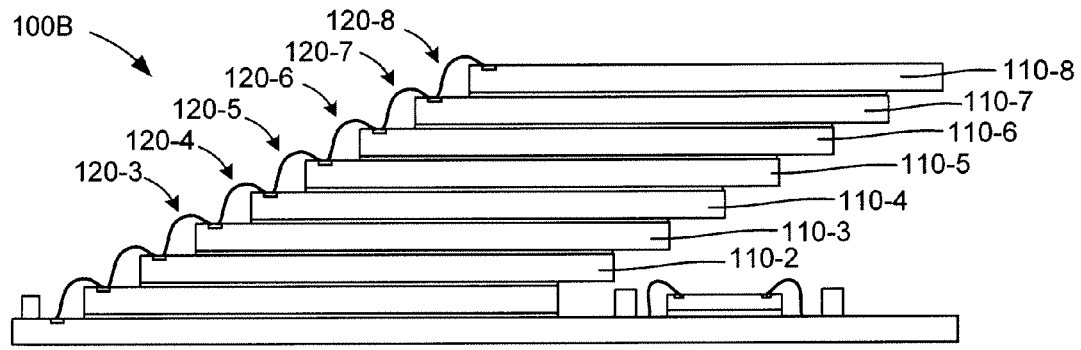
FIG. 12 is a simplified side view showing the assembly of FIG. 11(A) after several additional IC dies are mounted and wire bonded.

Referring again to FIG. 2, the processes of blocks 250 and 260 are repeated for each successive IC die mounted onto the assembly until the memory device is completed (aside from the optional molding housing, discussed below). FIG. 12 is a simplified side view showing an exemplary memory device 100B produced after seven iterations of the processes of blocks 250 and 260. In particular, memory device 100B includes a third IC die 110-3 mounted on IC die 110-2 (discussed above) and electrically connected by third wire bonds 120-3, a fourth IC die 110-4 mounted on IC die 110-3 and electrically connected by fourth wire bonds 120-4, a fifth IC die 110-5 mounted on IC die 110-4 and electrically connected by fifth wire bonds 120-5, a sixth IC die 110-6 mounted on IC die 110-5 and electrically connected by sixth wire bonds 120-6, a seventh IC die 110-7 mounted on IC die 110-6 and electrically connected by seventh wire bonds 120-7, and an eighth IC die 110-8 mounted on IC die 110-7 and electrically connected by eighth wire bonds 120-8.

Figure 13:
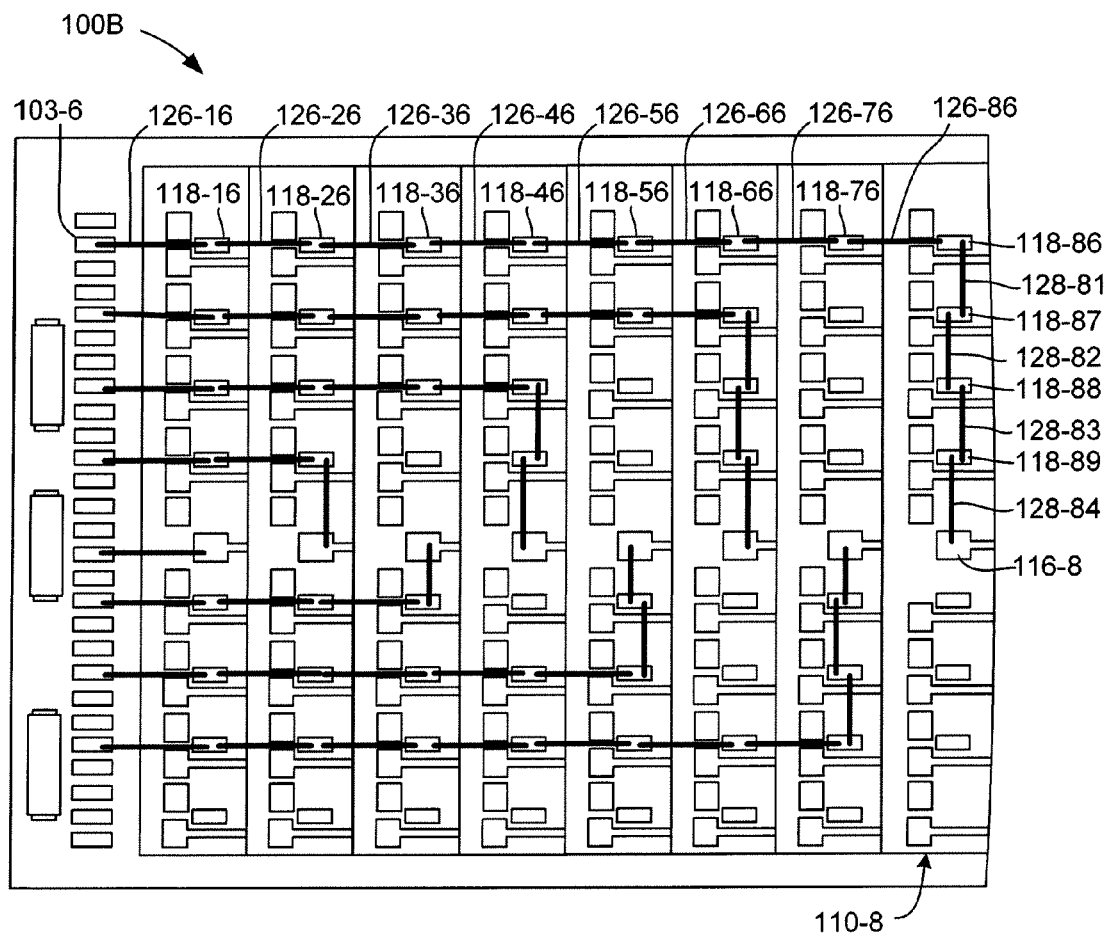
FIG. 13 is a top plan view showing a portion of the assembly of FIG. 12 in additional detail.

FIG. 13 is a simplified top plan view depicting the eight dedicated transmission paths associated with memory device 100B. For illustrative purposes, FIG. 13 omits all bonding wires associated with the shared function transmission paths, and the bonding wires associated with each of the dedicated transmission path are indicated in thick straight lines. FIG. 13 illustrates that, given a sufficient number of step pads, any number of dedicated transmission paths can be produced between substrate 101 and any selected number of IC die using only relatively short wire bonds (i.e., die-to-die bonds 126 and optional intra-die bonds 128). For example, the dedicates signal path for transmitting signals between bonding pad 103-6 and dedicated contact pad 116-8 of IC die 110-8 includes bonding wire 126-16, step pad 118-16, bonding wire 126-26, step pad 118-26, bonding wire 126-36, step pad 118-36, bonding wire 126-46, step pad 118-46, bonding wire 126-56, step pad 118-56, bonding wire 126-66, step pad 118-66, bonding wire 126-76, step pad 118-76, bonding wire 126-86, step pad 118-86, intra-die wire 128-81, step pad 118-87, intra-die wire 128-82, step pad 118-88, intra-die wire 128-83, step pad 118-89, and intra-die wire 128-84. Additional dedicated signal paths are facilitated, for example, by increasing the number of step pads formed on each IC die.

Figure 14:
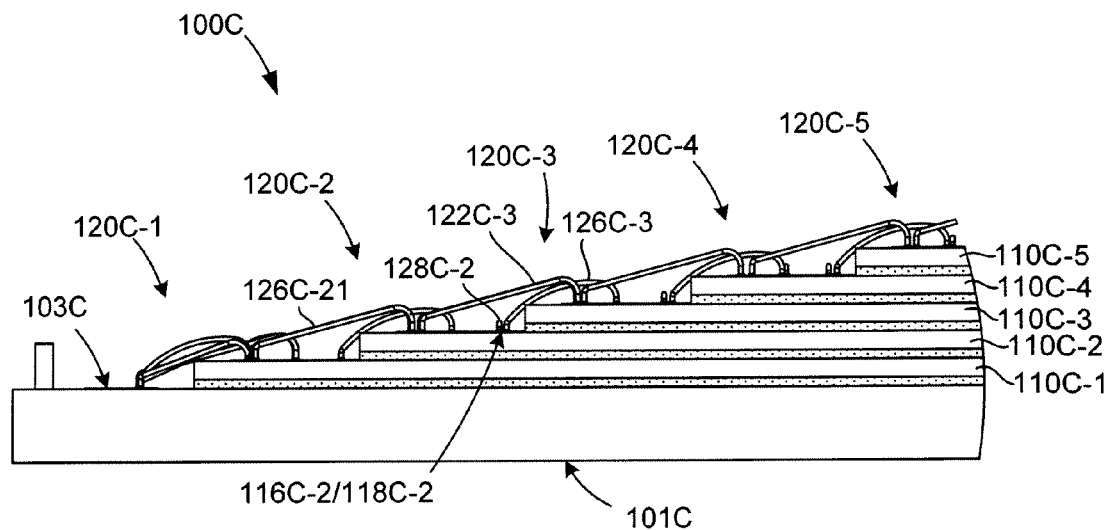
FIG. 14 is partial enlarged side view showing a memory device according to an embodiment of the present invention.

FIG. 14 is partial enlarged side view showing a memory device 100C according to another specific embodiment of the present invention. Memory device 100C includes an IC dies 110C-1 to 110C-5 mounted on a substrate 101C and connected by way of bonding wire sets 120C-1 to 120C-5 in a manner similar to that described above. However, in accordance with another aspect of the present invention, each bonding wire sets 120C-2 to 120C-5 is formed such that their respective intra-die wires are formed close to the upper surface of IC dies 110C-2 to 110C-5, respectively, such that the die-to-die wires of the subsequently formed bonding wire set extend over the intra-die wires associated with the previously formed bonding wire set. For example, second bonding wire set 120C-2 includes a intra-die wire 128C-2 (shown in end view) connected between step pad 118C-2 and contact pad 116C-2 (also shown in end view), where intra-die wire 128C-2 is disposed below die to die bonding wire 122C-3 of third bonding wire set 120-3.

Figure 15A:
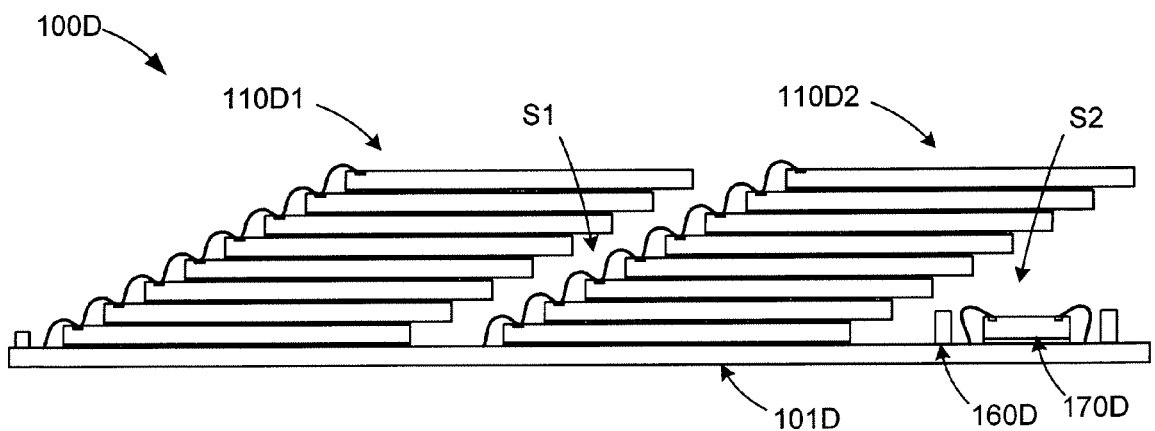
FIG. 15(A) is a simplified side view showing a memory device including multiple IC die stacks according to another embodiment of the present invention.
Figure 15B:
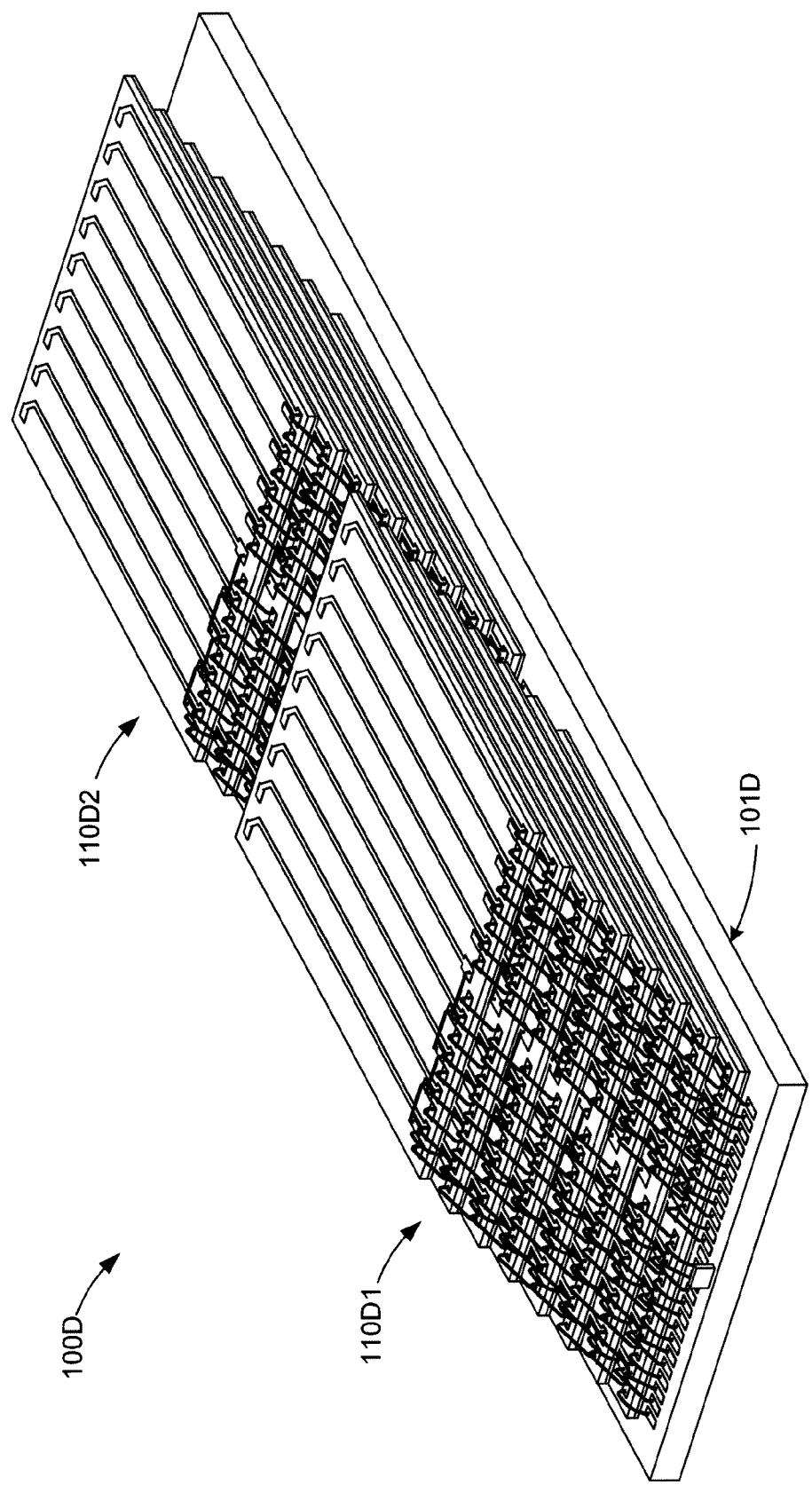
FIG. 15(B) is a perspective view showing a memory device of FIG. 15(A) in additional detail according to another embodiment of the present invention.

FIG. 15(A) are simplified side and perspective views showing a memory device 100D including two "staircase" stacks 110D1 and 110D2 disposed on a substrate 101D according to another embodiment of the present invention. As indicated in these figures, each stack 110D1 and 110D2 includes multiple IC devices and associated wire bond sets that are essentially identical to that of memory device 100B (described above with reference to FIG. 12). As indicated in FIG. 15(A), second stack 110D2 is at least partially disposed in overhang space S1 defined by first stack 110D1 in order to maximize memory capacity while minimizing the size of substrate 101D. Note that, because the present invention provides dedicated signal paths to each IC die of first stack 110D1 by way of short bonding wires that extend up the "staircase", the present invention facilitates the formation of multiple stack structures, such as those illustrated in FIGS. 15(A) and 15(B). As in previous embodiments, passive components 160 and additional IC die 170 are disposed on substrate 101D in a second overhang space S2 defined by second stack 110D2 to further utilize the available substrate area. Accordingly, memory device 100D illustrates how the present invention facilitates the production of large volume memory devices having minimal size.

Although the electrically isolated step pads of the present invention are described above with reference to transmitting dedicated controls signals to stacked memory dies, the step pads may also be utilized to transmit signals to other types of dies as well.

Figure 16A:
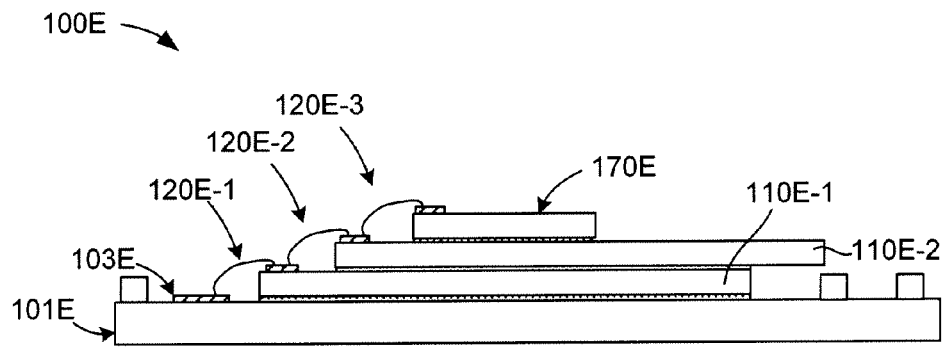
FIGS. 16(A) and 16(B) are side and top plan views, respectively, showing a memory device according to another embodiment of the present invention.
Figure 16B:
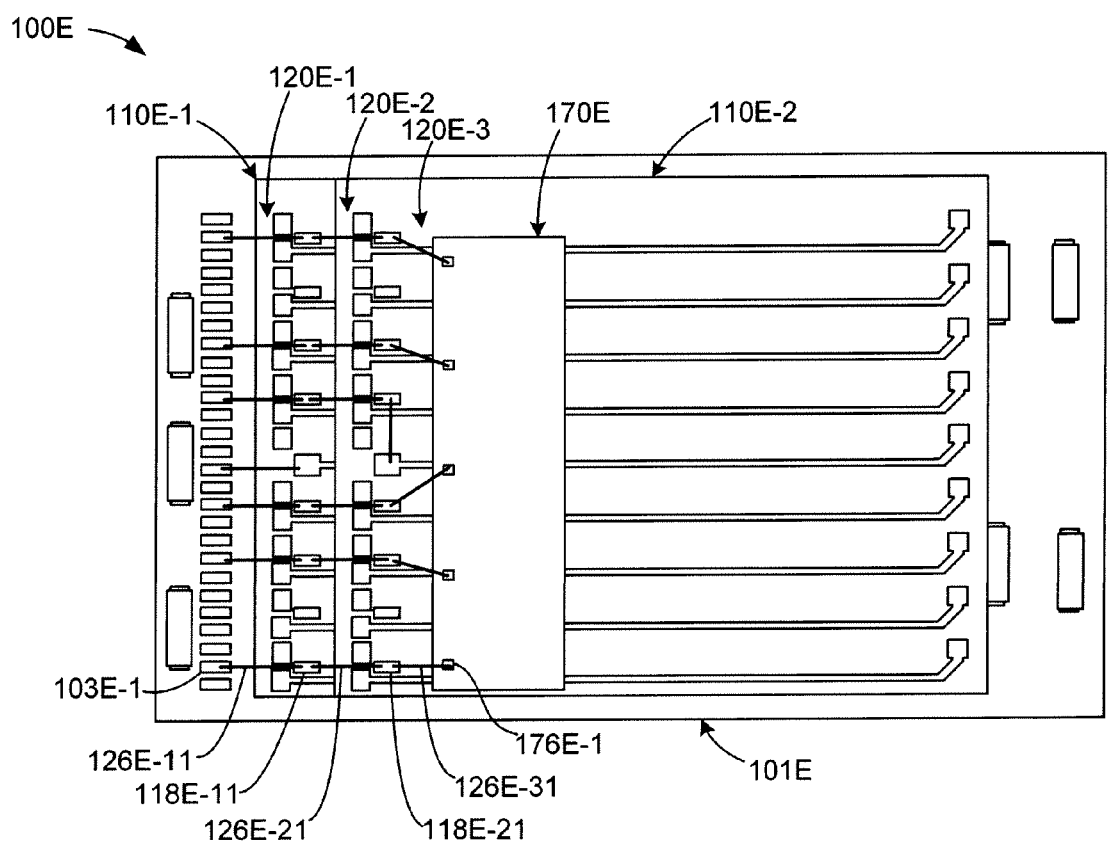

FIGS. 16(A) and 16(B) are side and simplified top plan views, respectively, showing an electronic device 101E according to another embodiment of the present invention. Device 100E includes a first IC die 110E-1 and a second IC die 110E-2 that are stacked on substrate 101E in the manner described above, and are connected by way of wire bond sets 120E-1 and 120E-2 in the manner described above. In addition, a controller (or other circuit type) die 170E is mounted onto second IC die 170E, and is connected by way of a third bond wire set 120E-3. FIG. 16(B) illustrates the dedicated transmission paths utilized to transmit dedicates signals to controller die 170E (all shared transmission paths between substrate 110E and IC dies 110E-1 and 110E-2 are omitted for illustrative purposes). As indicated, each contact pad of controller die 170E is connected to an associated bonding pad by way of associated step pads and die-to-die bonding wires. For example, contact pad 176E-1 of controller die 170E is connected to contact pad 103E-1 by way of bonding wire 126E-11 (which is part of set 120E-1), step pad 118-11 (formed on IC die 110E-1), bonding wire 126E-21 (which is part of set 120E-2), step pad 118-21 (formed on IC die 110E-2), and bonding wire 126E-31 (which is part of set 120E-3). Note that the dedicated transmission pads to IC dies 110E-1 and 110E-2, similar to those described above, are also included in FIG. 16(B), thereby illustrating that the step pads of the present invention can be utilized in a variety of ways to facilitate space efficient, stacked IC arrangements.

Figure 17A:
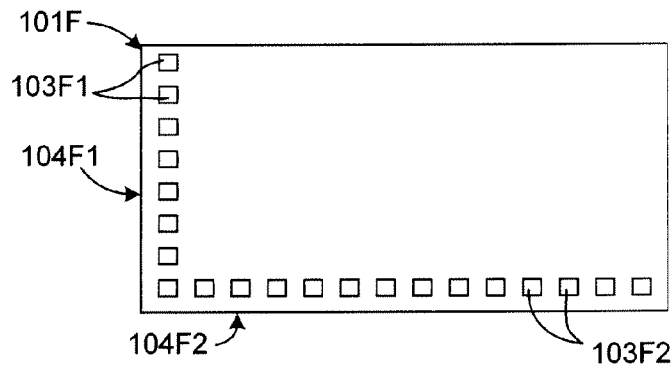
FIGS. 17(A), 17(B) and 17(C) are top views showing IC dies stacked in accordance with another embodiment of the present invention.
Figure 17B:
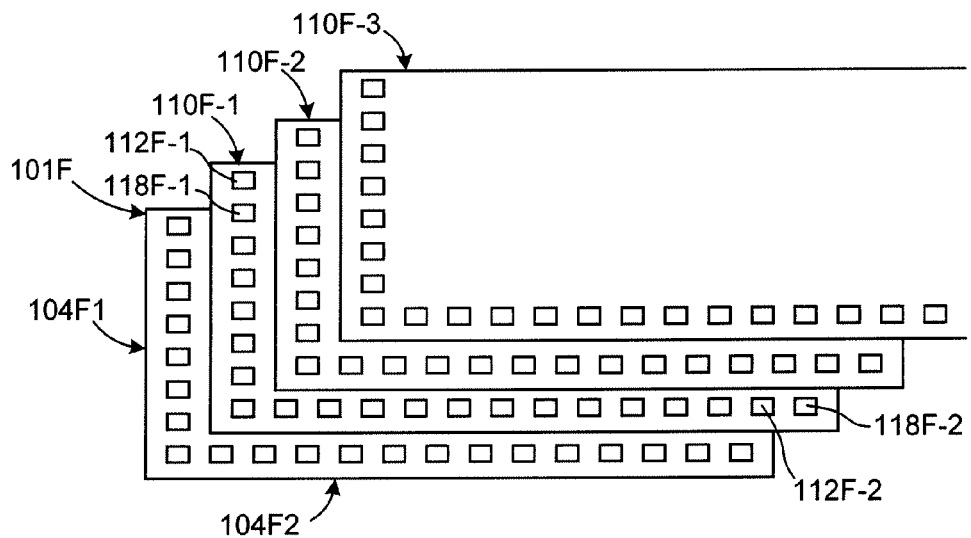
Figure 17C:
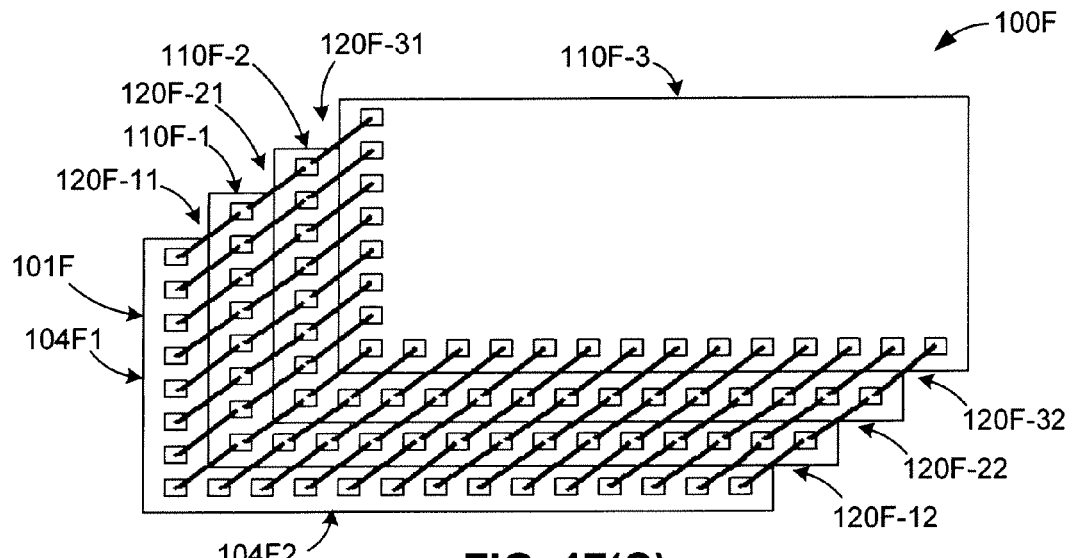

Although the present invention is described with reference to bonding and contact pads aligned along the single edge of a substrate/die, the present invention may also be utilized to produce stacking arrangements in bonding/contact pads are arranged along two or more edges. For example, FIGS. 17(A), 17(B) and 17(C) are top views illustrating a two way offset stacking arrangement in accordance with another embodiment of the present invention. Referring to FIG. 17(A), a substrate 101F includes bonding pads 103F-1 aligned along a first side edge 104F-1, and second bonding pads 103F-2 aligned along a second side edge 104F-2 that is orthogonal to first side edge 104F-1. FIG. 17(B) shows IC dies 110F-1, 110F-2 and 110F-3 mounted on substrate 101F in a two-way offset stacking arrangement such that contact pads and step pads disposed along orthogonal side edges of each IC die are exposed. For example, contact pad 112F-1 and step pad 118F-1 of IC die 110F-1 are aligned parallel to side edge 104F-1 of substrate 101F, and contact pad 112F-2 and step pad 118F-2 of IC die 110F-1 are aligned parallel to side edge 104F-2 of substrate 101F. Those skilled in the art will recognize that aspects of the present invention may also be utilized in the production of electronic devices using other stacking arrangements (e.g., pyramid or staggered) as well.

Figure 18A:
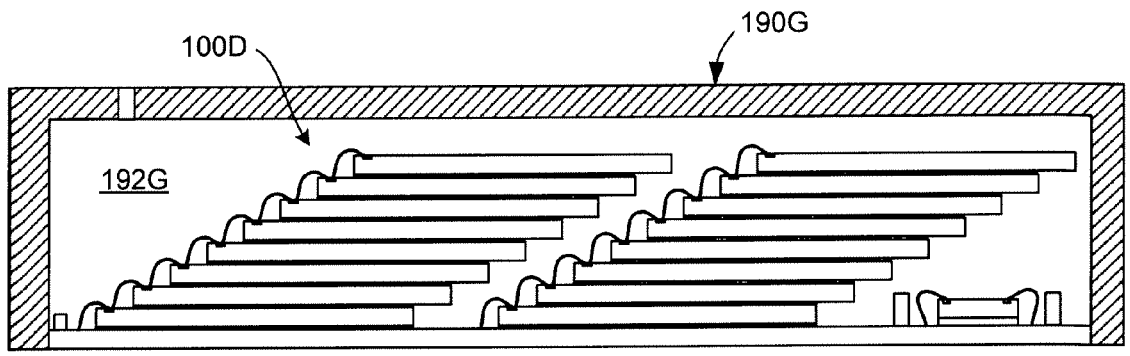
FIGS. 18(A), 18(B) and 18(C) are simplified side views showing the formation of a molded plastic housing over the electronic device of FIG. 14 in accordance with another embodiment of the present invention.
Figure 18B:
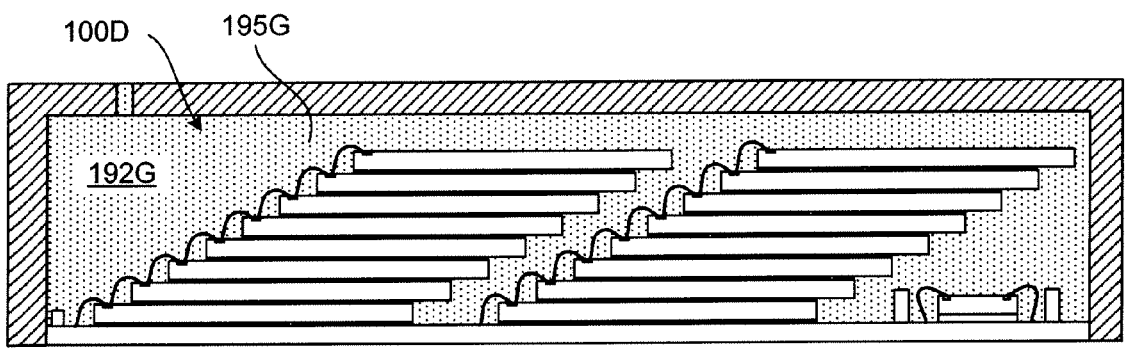
Figure 18C:
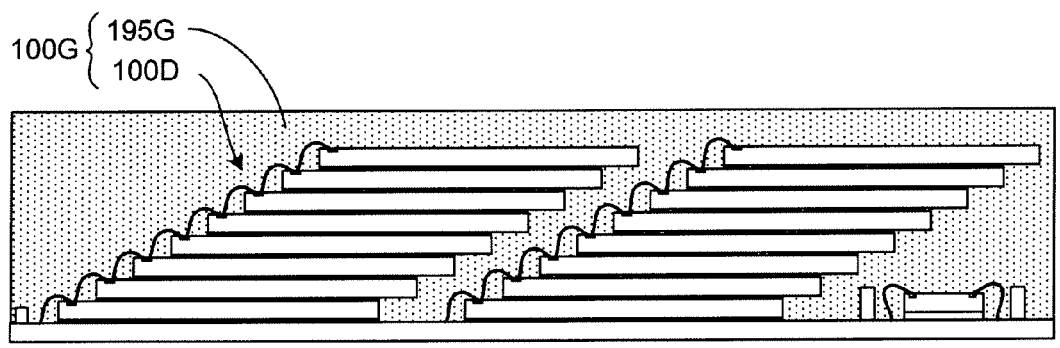
Figure 19:
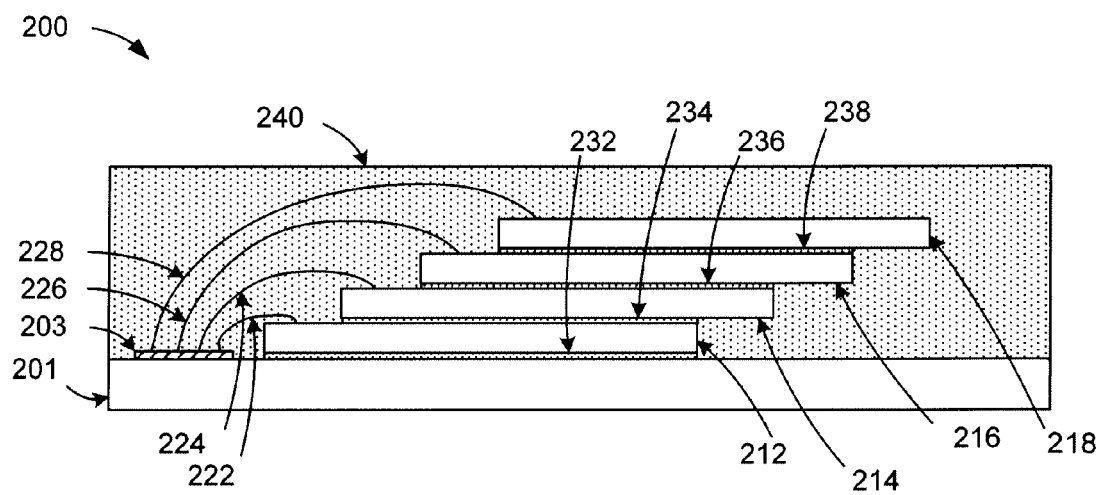
FIG. 19 is a simplified cross-sectional side view showing a conventional memory device having a "staircase" stacking arrangement.
Figure 20:
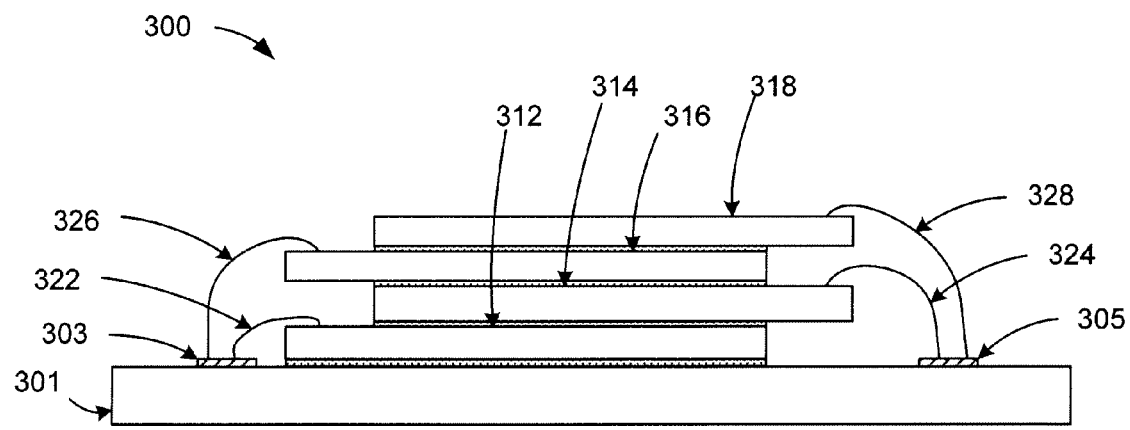
FIG. 20 is a simplified cross-sectional side view showing a conventional memory device having a "staggered" stacking arrangement.
Figure 21:
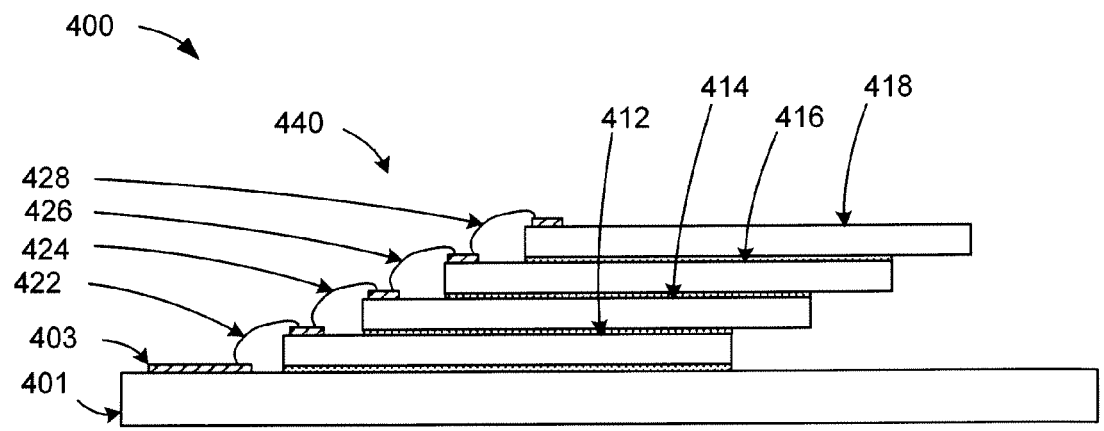
FIG. 21 is a simplified cross-sectional side view showing another conventional memory device having a "staircase" stacking arrangement.
Figure 22:
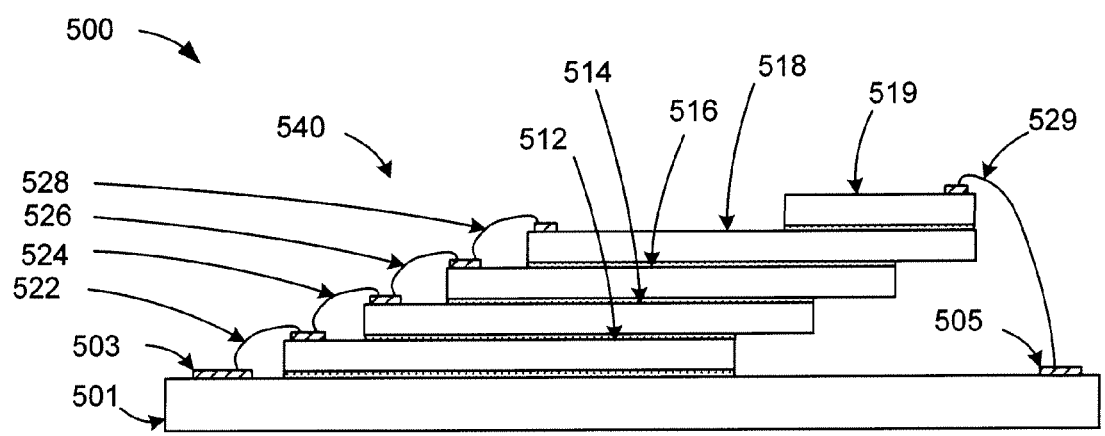
FIG. 22 is a simplified cross-sectional side view showing another conventional memory device having a "staggered" stacking arrangement.

FIGS. 18(A), 18(B) and 18(C) are simplified side views showing the formation of an exemplary molded plastic housing in accordance with block 280 of FIG. 2. As indicated in FIG. 18(A), a selected stacked IC device (e.g., device 100D, described above with reference to FIGS. 15(A) and 15(B)) is placed inside a molding structure 190G such that a chamber 192G is defined by molding structure 190G over the IC stacks of device 100D. As indicated in FIG. 18(B), a plastic molding material 195G is then injected into chamber 192G over device 100D. As indicated in FIG. 18(C), completed IC device 100G, which includes hardened plastic molded housing 195G disposed over device 100D, is then removed from the molding structure.

As illustrated by the various specific embodiments presented above, the present invention facilitates the assembly and production of high density memory modules and other types of electronic devices that utilized stacked IC arrangements. With the trend of electronic devices toward packing more functions and higher memory capacity into smaller packages, stacked IC die arrangements are becoming more and more important. The present invention enables manufacturers to stack more logic functions dies and memory dies with high efficiency and reliability by eliminating the need for long bonding wires that are needed in the conventional approaches to provide dedicated transmission paths to the uppermost stacked ICs. In particular, by providing step pads on one or more IC die in an IC die stack, the present invention facilitates forming bonding wires that are as short as possible in order to minimize the risk of breakage during the molding process. The bonding wire arrangement described herein also facilitates re-work in the event of a wire break or mistake by avoiding multiple wiring layers. The shorter bonding wires also minimize parasitic inductance that is characteristic of longer wires. Finally, the bonding wire arrangements of the present invention facilitate a larger number of stacked IC die without worrying about wire length limitation.

Although the present invention has been described with respect to certain specific embodiments, it will be clear to those skilled in the art that the inventive features of the present invention are applicable to other embodiments as well, all of which are intended to fall within the scope of the present invention. For example, although the present invention is described herein with specific reference to "staircase" stacked arrangements, the use of step pads may be utilized to form dedicated signal paths in other stacked die arrangements as well, such as offset "staggered" and pyramid stacking arrangements.

The invention claimed is:

1. An electronic device comprising:
a substrate including a plurality of bonding pads;
a first integrated circuit (IC) die mounted on the substrate, the first IC die including a first electronic circuit, first functional contact pads that are internally connected to said electronic circuit, and a first electrically isolated step pad;
a plurality of first bonding wires extending between said substrate and said first IC die, said first bonding wires including a first step wire connected between a first bonding pad of said plurality of bonding pads and said first electrically isolated step pad;
a second IC die mounted on the first IC die in an offset stacked arrangement, the second IC die including a second electronic circuit and second functional contact pads that are internally connected to said second electronic circuit, the second IC die also including zero or more second electrically isolated step pads; and
a plurality of second bonding wires including one or more second die-to-die wires extending between said first IC die and said second IC die, and zero or more second intra-die wires,
wherein each of said zero or more second intra-die wires is connected between an associated first one of said second electrically isolated step pads and one of an associated one of said second functional contact pads, and an associated second one of said second electrically isolated step pads, and
wherein said first step wire and at least one wire of said plurality of second wires form a dedicated transmission path between said first bonding pad and said selected second functional contact pad by way of said first electrically isolated step pad.

2. The electronic device of claim 1,
wherein the first functional contact pads of the first IC die include a first shared signal contact pad,
wherein the plurality of first bonding wires include a first bonding wire connected between a second bonding pad of said plurality of bonding pads and said first shared signal contact pad,
wherein the second functional contact pads of the second IC die include a second shared signal contact pad, and
wherein the plurality of second bonding wires include a second bonding wire connected between said first shared signal contact pad and said second shared signal contact pad.

3. The electronic device of claim 2, wherein the first and second IC devices comprises memory devices.

4. The electronic device of claim 1,
wherein the first IC die comprises an insulation layer disposed on a surface thereof over said first electronic circuit, first contact pins disposed along a first edge of the first IC die, second contact pins disposed along a second edge of the first IC die, and a passivation layer disposed on the insulation layer,
wherein both said first and second contact pins are electrically connected to said first electronic circuit, and extend through the insulation layer,
wherein a first group of said first functional contact pads is disposed adjacent to said first edge of the IC die and exposed through the passivation layer, wherein each first functional contact pad of said first group is electrically connected to a corresponding one of said first contact pins, wherein a second group of said first functional contact pads is disposed adjacent to said first edge of the IC die and exposed through the passivation layer, wherein each second functional contact pad of said second group is electrically connected to a corresponding one of said second contact pins by way of an associated elongated conductor that is disposed between the insulation layer and the passivation layer and extends across the first IC die, and wherein said first electrically isolated step pad is disposed on said insulation layer adjacent to said first and second groups of said first functional contact pads.

5. The electronic device of claim 1, further comprising one or more additional IC dies disposed on said second IC die in a staircase stacked arrangement, wherein at least one of said second IC die and said one or more additional IC dies defines an overhang space over a portion of said substrate, and wherein said electronic device further comprises one of a passive component and a third IC die disposed on the substrate in said overhang space.

6. The electronic device of claim 1, further comprising a third IC die mounted on the second IC die, and a plurality of third bonding wires including third die-to-die wires extending between said second IC die and said third IC die, wherein said plurality of second bonding wires includes a first intra-die wire connected between a predetermined one of said second electrically isolated step pads and a predetermined one of said second functional contact pads, and wherein the second intra-die wire is disposed below at least one of said plurality of third bonding wires.

7. The electronic device of claim 1, wherein the electronic device comprises a first staircase stack including said first and second IC dies, said first staircase stack a first overhang space over a first portion of said substrate, and wherein the electronic device comprises a second staircase stack including a plurality of additional IC dies, wherein at least some of said plurality of additional IC devices are disposed on said substrate and located in said first overhang space.

8. The electronic device of claim 7, wherein the second staircase stack defines a second overhang space over a second portion of said substrate, and wherein said electronic device further comprises one of a passive component and a third IC die disposed on the substrate in said second overhang space.

9. The electronic device of claim 1, further comprising a third IC die mounted on the second IC die, and a plurality of third bonding wires extending between said second IC die and said third IC die, wherein a second step wire of said plurality of first wires, a third step wire of said plurality of second wires, and at least one wire of said plurality of third wires form a dedicated transmission path between said a second bonding pad of said plurality of bonding pads and a selected third functional contact pad of said third IC die by way of a second electrically isolated step pad disposed on said first IC die and a third electrically isolated step pad disposed on said second IC die.

10. The electronic device of claim 9, wherein the first and second IC dies comprises memory devices and said third IC die comprises a memory controller circuit.

11. The electronic device of claim 1, further comprising a plastic molded housing disposed over said first and second IC dies.

12. A method for manufacturing an electronic device comprising:

mounting a first integrated circuit (IC) die onto a substrate such that first contact pads of the first IC die are disposed adjacent to a row of bonding pads disposed on the substrate, wherein the first IC die includes a first electronic circuit, and wherein the first contact pads include first functional contact pads that are internally connected to said electronic circuit and a first electrically isolated step pad;

forming a plurality of first bonding wires such that each of said plurality of first bonding wires extends between said substrate and said first IC die, wherein said first bonding wires including a first step wire connected between a first bonding pad of said plurality of bonding pads and said first electrically isolated step pad;

mounting a second IC die on the first IC die in an offset stacked arrangement, the second IC die including a second electronic circuit and second functional contact pads that are internally connected to said second electronic circuit, the second IC die also including zero or more second electrically isolated step pads; and forming a plurality of second bonding wires including one or more second die-to-die wires extending between said first IC die and said second IC die, and zero or more second intra-die wires, wherein each of said zero or more second intra-die wires is connected between an associated first one of said second electrically isolated step pads and one of an associated one of said second functional contact pads, and an associated second one of said second electrically isolated step pads, and wherein said first step wire and at least one wire of said plurality of second wires form a dedicated transmission path between said first bonding pad and said selected second functional contact pad by way of said first electrically isolated step pad.

13. The method of claim 12, wherein the first functional contact pads of the first IC die include a first shared signal contact pad, and the second functional contact pads of the second IC die include a second shared signal contact pad, wherein forming the plurality of first bonding wires further comprises forming a first bonding wire between a second bonding pad of said plurality of bonding pads and said first shared signal contact pad, and wherein forming the plurality of second bonding wires comprises forming a second bonding wire between said first shared signal contact pad and said second shared signal contact pad.

14. The method of claim 12, further comprising mounting one or more additional IC dies on said second IC die in a staircase stacked arrangement, wherein at least one of said second IC die and said additional IC dies defines an overhang space over a portion of said substrate, and wherein the method further comprises, before mounting said second IC die, mounting one of a passive component and a third IC die on the substrate such that said one of a passive component and a third IC die are disposed in said overhang space when said one or more additional IC dies are mounted.

15. The method of claim 12, wherein forming said plurality of second bonding wires includes forming a first intra-die wire between a predetermined one of said second electrically isolated step pads and a predetermined one of said second functional contact pads, and wherein said method further comprises:

mounting a third IC die the second IC die; and forming a plurality of third bonding wires including third die-to-die wires extending between said second IC die and said third IC die, wherein at least one of said plurality of third bonding wires extends over said second intra-die wire.

16. The method of claim 12, further comprising simultaneously forming a first staircase stack including said first and second IC dies and a second staircase stack such that said first staircase stack at least partially overhangs said second staircase stack.

17. The method of claim 16, wherein the second staircase stack defines a second overhang space over a second portion of said substrate, and wherein the method further comprises mounting one of a passive component and a third IC device on the substrate such that said one of a passive IC device and a third IC device are disposed in said second overhang space when said one or more additional IC dies are mounted.

18. The method of claim 12, further comprising:

mounting a third IC die on the second IC die; and forming a plurality of third bonding wires extending between said second IC die and said third IC die, wherein forming said pluralities of first, second and third bonding wires includes forming a second step wire of said plurality of first wires, a third step wire of said plurality of second wires, and at least one wire of said plurality of third wires such that a dedicated transmission path is formed between said a second bonding pad of said plurality of bonding pads and a selected third functional contact pad of said third IC die by way of a second electrically isolated step pad disposed on said first IC die and a third electrically isolated step pad disposed on said second IC die.

19. The method of claim 12, further comprising forming a plastic molded housing over said first and second IC dies.

* * * * *